United States Patent [19]

Kubokoya et al.

[11] Patent Number: 5,342,802
[45] Date of Patent: Aug. 30, 1994

[54] METHOD OF MANUFACTURING A COMPLEMENTARY MIS TRANSISTOR

[75] Inventors: Ryoichi Kubokoya; Hiroyuki Yamane, both of Anjo; Yasushi Higuchi, Kariya, all of Japan

[73] Assignee: Nippondenso Co., Ltd., Kariya, Japan

[21] Appl. No.: 47,543

[22] Filed: Feb. 24, 1993

Related U.S. Application Data

[62] Division of Ser. No. 680,148, Apr. 3, 1991, Pat. No. 5,216,272.

[30] Foreign Application Priority Data

Apr. 13, 1990 [JP] Japan ................................. 2-97898
Jan. 22, 1991 [JP] Japan ................................. 3-5974

[51] Int. Cl.⁵ .......................................... H01L 21/70
[52] U.S. Cl. ........................................ 437/57; 437/44; 437/34; 437/56; 148/DIG. 82
[58] Field of Search ................. 437/34, 44, 57, 56, 437/913, 57; 148/DIG. 82

[56] References Cited

U.S. PATENT DOCUMENTS

| | | | |
|---|---|---|---|
| 4,173,818 | 11/1979 | Bassous et al. | 357/23.8 |
| 4,729,001 | 3/1988 | Haskell | 357/23.8 |
| 4,819,045 | 4/1989 | Murakami | 357/23.8 |
| 4,908,327 | 3/1990 | Chapman | 437/44 |
| 4,924,277 | 5/1990 | Yamane et al. | |
| 4,933,730 | 6/1990 | Shirato | 357/23.8 |
| 4,949,136 | 8/1990 | Jain | 357/23.8 |
| 4,956,308 | 9/1990 | Griffin et al. | 437/44 |
| 4,968,639 | 11/1990 | Bergonzoni | 437/44 |
| 5,023,190 | 6/1991 | Lee et al. | 357/23.8 |
| 5,122,474 | 6/1992 | Harrington, III . | |

FOREIGN PATENT DOCUMENTS

| | | | |
|---|---|---|---|
| 60-142557 | 7/1985 | Japan | 357/42 |
| 62-112372 | 5/1987 | Japan | 357/23.8 |
| 62-133763 | 6/1987 | Japan | 357/23.8 |
| 62-141754 | 6/1987 | Japan | 357/23.8 |
| 62-224974 | 10/1987 | Japan | 357/23.3 |
| 1037055 | 2/1989 | Japan | 357/23.3 |
| 1064364 | 3/1989 | Japan | 357/23.8 |
| 2129968 | 5/1990 | Japan | 357/23.5 |

OTHER PUBLICATIONS

Nikkei Electronics 1976, 5.31 pp. 66-77, published on Jun. 25, 1987.
Proceedings of the 6th Conference on solid State Devices, Tokyo 1974 (Yoshida I.).
Supplement to the Journal of the Japan Society of Applied Physics, vol. 44, 1975 pp. 249-255 "Device Design of an Ion Implanted Voltage, MOSFET", published 1974/1975.

*Primary Examiner*—Tom Thomas
*Assistant Examiner*—Tuan Nguyen
*Attorney, Agent, or Firm*—Cushman, Darby & Cushman

[57] ABSTRACT

A high withstanding voltage MIS transistor, including an offset region and a double offset region in a region of a semiconductor substrate. The region of the semiconductor substrate has a first conductivity type. The offset region connects to a drain region, and has a second conductivity type. An impurity concentration of the offset region is lower than that of the drain region. The double offset region has the first conductivity type. At least a portion of the double offset region overlaps with the offset region. An impurity concentration of the double offset region is higher than that of the region of the semiconductor substrate. The disclosed structure has an improved current gain of the MIS transistor is improved.

A method of manufacturing a CMOS having such a MIS transistor decreases the number of the manufacturing steps because the double offset region of a first conductivity type channel MIS transistor and the offset region of a second conductivity type channel MIS transistor are simultaneously formed.

13 Claims, 24 Drawing Sheets

METHOD OF MANUFACTURING A COMPLEMENTARY MIS TRANSISTOR

This is a division of application Ser. No. 07/680,148, filed Apr. 3, 1991, now U.S. Pat. No. 5,216,272.

BACKGROUND OF THE INVENTION

1. Field of the Invention

The present invention relates to a MIS (Metal Insulator Semiconductor) transistor with high withstanding voltage, and a method of manufacturing a complementary transistor having such a MIS transistor. The present invention can improve the current gain of the MIS transistor.

2. Description of the Related Art

A conventional P type channel MOS (Metal Oxide Semiconductor) transistor is shown in FIG. 18A. The transistor has a drain region consisting of a high impurity concentration (P+) region 101 and an offset region 103 having a low impurity concentration (P−). A partial concentration of an electric field at the edge of a gate electrode 302 is restrained by the offset region 103. Consequently, the breakdown voltage of a drain junction of the transistor is improved. This structure is generally called "an offset gate structure".

Next, a method of manufacturing a CMOS (complementary-MOS) device having a P type channel transistor and an N type channel transistor having this offset gate structure will be explained with reference to FIGS. 20 to 23.

In FIG. 20, an N−type well region 100, a P−type well region 200, a gate oxide film 300, and a thick field oxide film (LOCOS) 301 are formed in a silicon substrate. As shown in FIG. 19, channel stopper regions 104 and 204 may be formed in the silicon substrate as the need arises. A gate electrode 302 is then selectively formed on the gate oxide film 300. A photoresist layer is deposited and selectively photoetched so that only a drain region of the N type channel transistor is uncovered. N type dopants, such as phosphorus (P), are ion-implanted into the P−type well region 200 to form a N−type offset region 203. The photoresist layer is then stripped.

In FIG. 21, a photoresist layer is deposited and selectively photoetched so that only a drain region of the P type channel transistor is uncovered. P type dopants, such as boron (B), are ion-implanted into the N−type well region 100 to form a P−type offset region 103. The photoresist layer is then stripped. It is to be noted that the order of forming the N−type offset region 203 and the P−type offset region 103 may be reversed.

In FIG. 22, a photoresist layer is deposited and selectively photoetched to uncover the regions that will form a P+type drain region 101 and a P+type source region 102. P type dopants are then ion-implanted into the exposed N−type well region 100,. with the photoresist used as a mask, to form the P+type drain region 101 and the P+type source region 102. The photoresist layer is then stripped.

In FIG. 23, a photoresist layer is deposited and selectively photoetched to uncover the regions that will form an N+type drain region 201 and an N+type source region 202. N type dopants are then ion-implanted into the exposed P−type well region 200, with the photoresist used as a mask, to form the N+type drain region 201 and the N+type source region 202. Therefore, the photoresist layer is stripped. Heat treatment is then carried out to activate the dopants.

After each region in the silicon substrate is formed, a passivation film 303 is formed. The contact portions of the passivation film 303 are opened. An electrode line 304 is formed on the passivation film 303 and the silicon substrate. Thus, a CMOS device having an offset gate structure is manufactured.

As described above, according to the conventional offset gate structure, it is necessary to carry out four photoetching steps and four ion-implanting steps to produce a high withstanding voltage structure. Specifically, the steps are to form the N−type offset region 203, the P−type offset region 103, the P+type drain and source regions 101, 102, and the N+type drain and source regions 201, 202. These steps are all preformed after the gate electrode 307 is formed.

Moreover, when the conventional MOS transistor shown in FIG. 18A is operated, as shown in an equivalent circuit in FIG. 18B, the offset region 103 acts as a high resistor because the impurity concentration of the offset region 103 is lower than that of the region 101. Therefore, the current gain of the MOS transistor is reduced. Especially, when the CMOS structure shown in FIG. 19 is adopted, the current gain of the device is reduced more because the size of the P type channel MOS transistor has to be bigger than that of the N type channel MOS transistor to balance between the current of the P type channel MOS transistor and that of the N type channel MOS transistor.

SUMMARY OF THE INVENTION

An object of the present invention, therefore, is to improve a current gain of a high withstanding voltage MIS transistor having an offset gate structure.

Another object of the present invention is to decrease the number of the manufacturing steps required to produce a CMOS device having such a high withstanding voltage MIS transistor.

To accomplish the above objects, a high withstanding voltage MIS transistor according to the present invention includes an offset region and a double offset region in a region of a semiconductor substrate. The region of the semiconductor substrate has a first conductivity type. The offset region connects to a drain region, and has a second conductivity type. An impurity concentration of the offset region is lower than that of the drain region. The double offset region has the first conductivity type. At least a portion of the double offset region overlaps with the offset region. An impurity concentration of the double offset region is higher than that of the region of the semiconductor substrate. The current gain of the MIS transistor is thus improved.

In a method of manufacturing a CMOS transistor, a semiconductor substrate having a first region and a second region is first prepared. The first region has a first conductivity type, and the second region has a second conductivity type. An insulating film covering surfaces of the first and the second regions is then formed. A first gate electrode and a second gate electrode are then formed on the insulating film over the first and the second regions respectively. First diffusion regions are then formed by implanting a first conductivity type impurity into the first and the second regions, wherein the first and the second gate electrodes are used as a mask. An impurity concentration of the first diffusion regions is higher than that of the first region. An offset region is then formed by implanting a second conductivity type impurity into at least one of the first diffusion regions in the first region. This diffusion region thus serves as a double offset region. At least a portion of the double offset region overlaps with the offset region. A first source region and a first drain region are then formed by implanting a second conductivity type impurity into the first region. The first drain region connects to the offset region. An impurity concentration of the offset region is lower than that of the first region. The offset region is disposed between the first gate electrode and the first drain region. A second source region and a second drain region are then formed by implanting a first conductivity type impurity into the second region. The impurity concentration of the second source region and the second drain region are higher than that of the first diffusion regions. According to such a method of manufacturing, the require number of the manufacturing step is decreased because the double offset region of a first conductivity type channel MIS transistor and the offset region of a second conductivity type channel MIS transistor are simultaneously formed.

BRIEF DESCRIPTION OF THE DRAWINGS

These and other objects and advantages of the present invention will become more apparent and will be more readily appreciated from the following detailed description of the presently preferred exemplary embodiments of the invention taken in conjunction with the accompanying drawings in which.

DESCRIPTION OF THE PREFERRED EMBODIMENTS

The preferred embodiments of the present invention will now be described with reference to the drawings.

Figure 1:
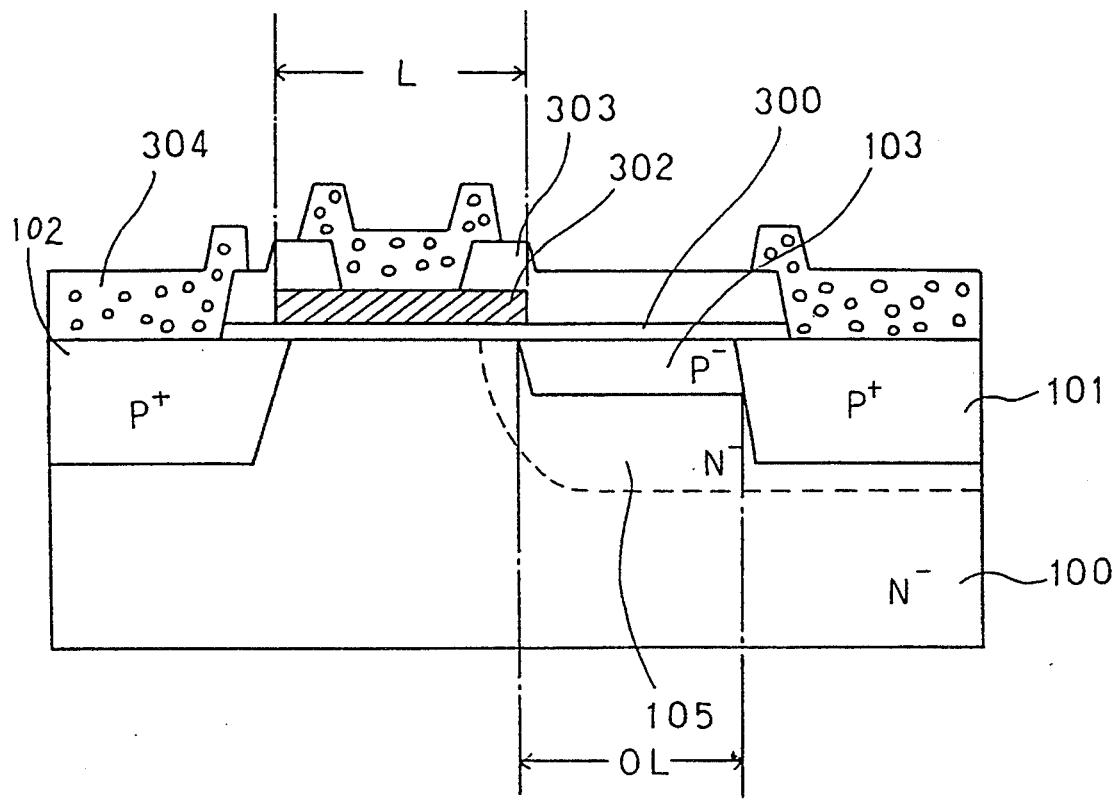
FIG. 1 is a sectional view of a P type channel MOS transistor of a preferred embodiment of the present invention.

In FIG. 1, an N type silicon substrate 100 has an impurity concentration of $1-5\times10^{16}/cm^3$. A source region 102 and a drain region 101 doped with P type impurities at a high concentration, that is $10^{19}-10^{20}/cm^3$, are formed in the silicon substrate 100. A P$^-$type offset region 103 doped with P type impurities at a low concentration, that is $10^{17}-10^{18}/cm^3$, is formed in the silicon substrate 100 to restrain a partial concentration of an electric field. The offset region 103 and the drain region 101 are surrounded by an N-type double offset region 105. The double offset region 105 is diffused wider and deeper than the offset region 103 and the drain region 101. An impurity concentration of the double offset region 105 is more than that of the silicon substrate, the impurity concentration being set in a range of between $10^{17}-10^{18}/cm^3$, for example $10^{17}/cm^3$. A gate oxide film 300, a gate electrode 302, a passivation film 303, and an electrode line 304 are formed on the silicon substrate 100. Thus, a P type channel MOS transistor is constructed.

It is noted that a high withstanding voltage MIS transistor is differentiated in structure from, what we call, a low voltage transistor that does not need to have a high withstanding voltage. Namely, although a gate length L of the low voltage transistor is less than 1 micrometer, that of the high withstanding voltage MIS transistor is more than 1 micrometer, generally more than 2 micrometer. When the gate length is more than 2 micrometer, punch through does not happen, and breakdown caused by avalanche breakdown becomes predominant. Moreover, although an offset length OL of the low voltage transistor is in a range between 0.1–0.2 micrometer, that of the high withstanding voltage MIS transistor is more than 1 micrometer.

Figure 18A:
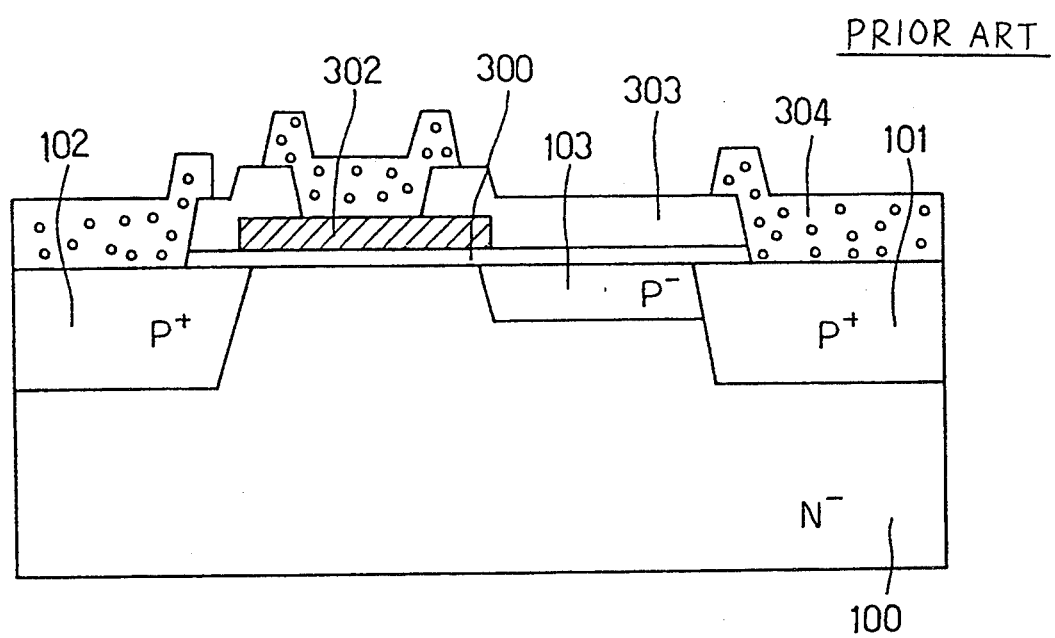
FIG. 18A is a sectional view of a conventional MOS structure.
Figure 18B:
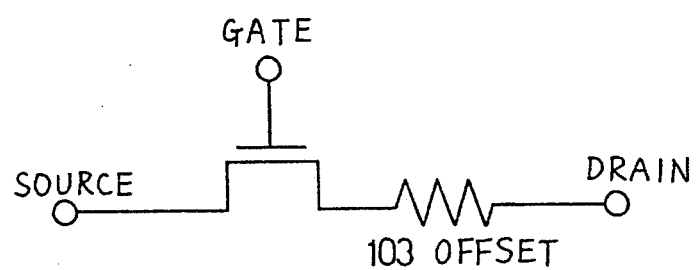
FIG. 18B is an equivalent circuit of the structure shown in FIG. 18A.
Figure 19:
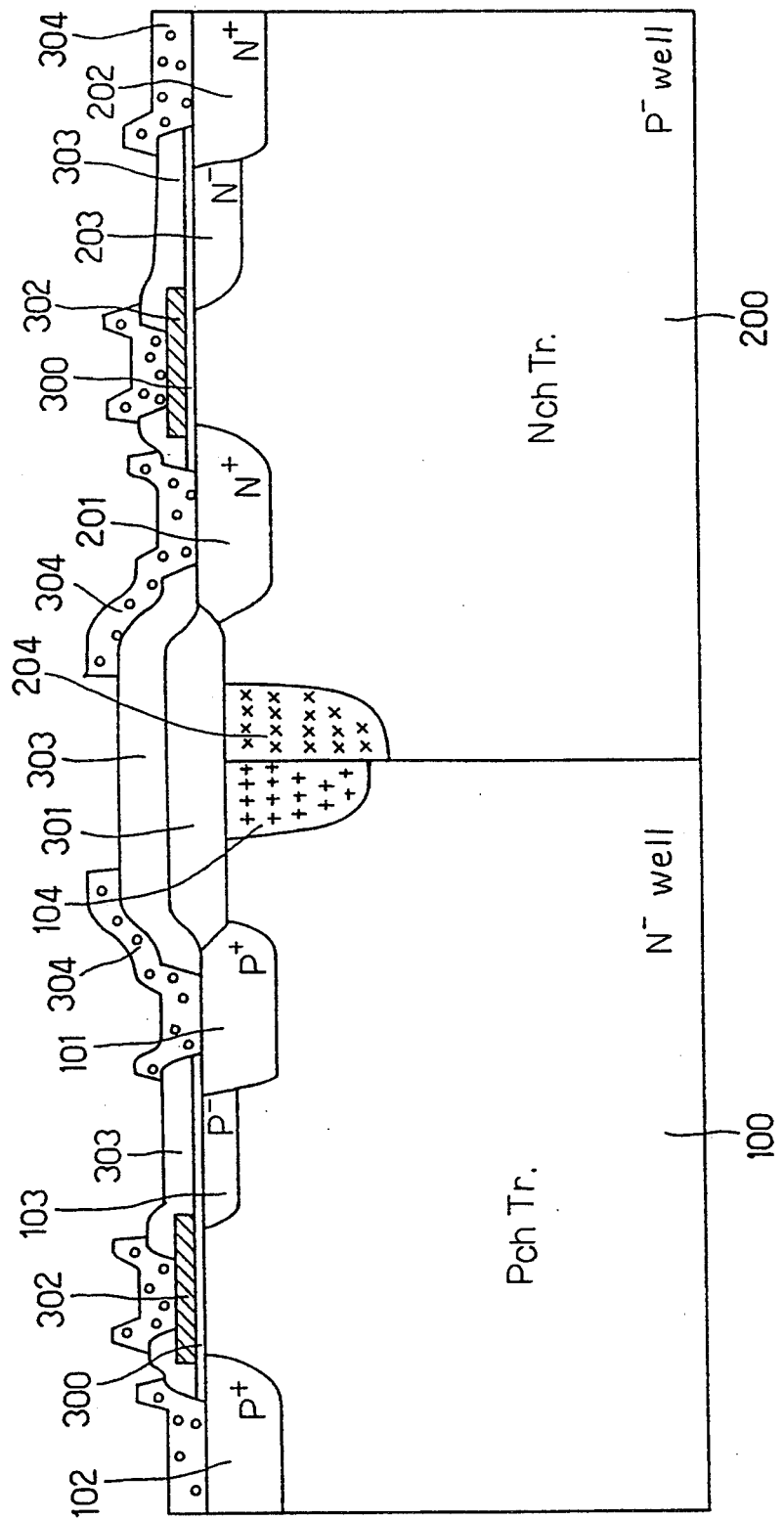
FIG. 19 is a sectional view of CMOS device having the structure shown in FIG. 18A.
Figure 20:
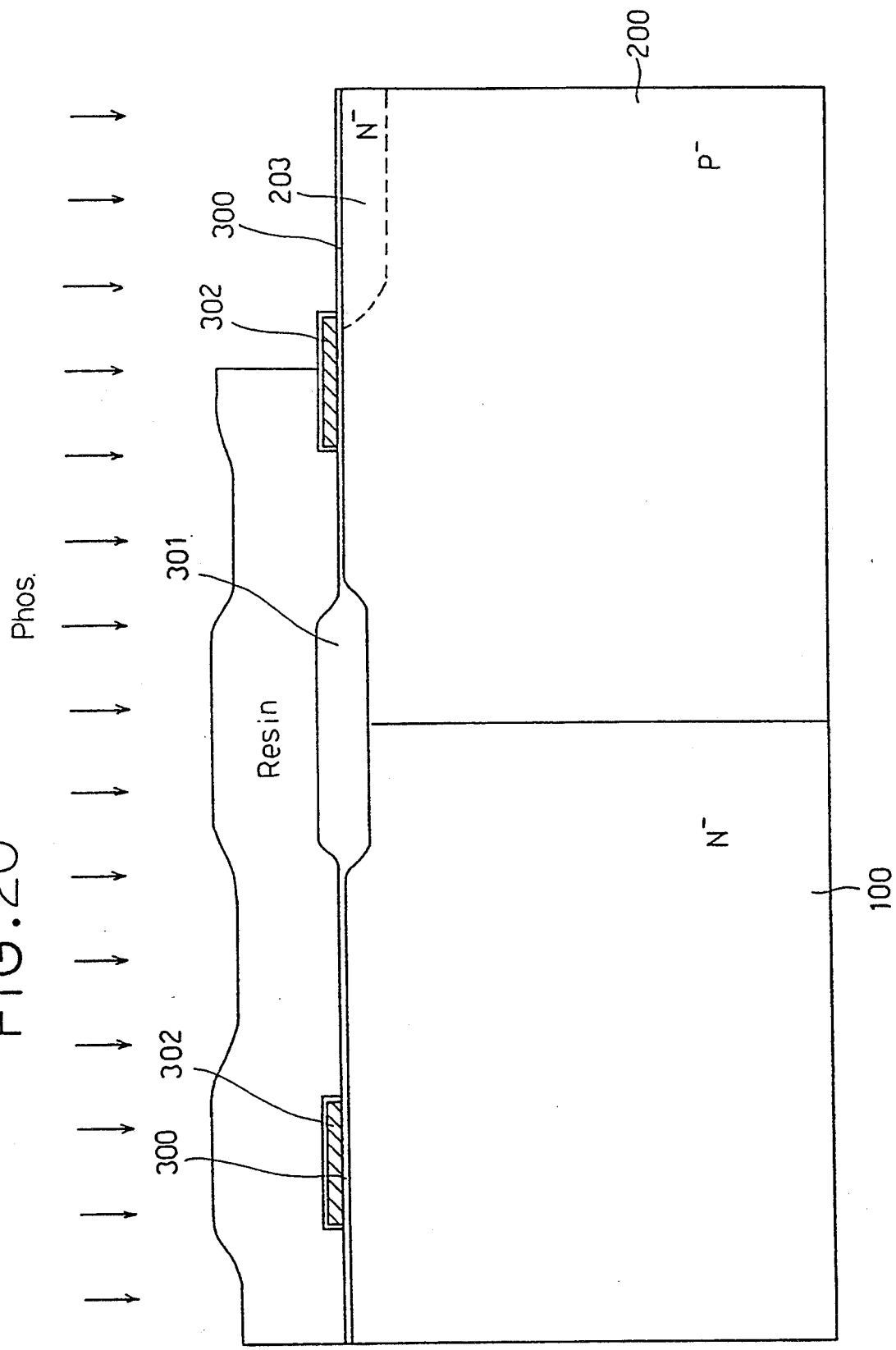
FIGS. 20 to 23 are sectional views for explaining the manufacturing processes of the CMOS device shown in FIG. 18A.
Figure 21:
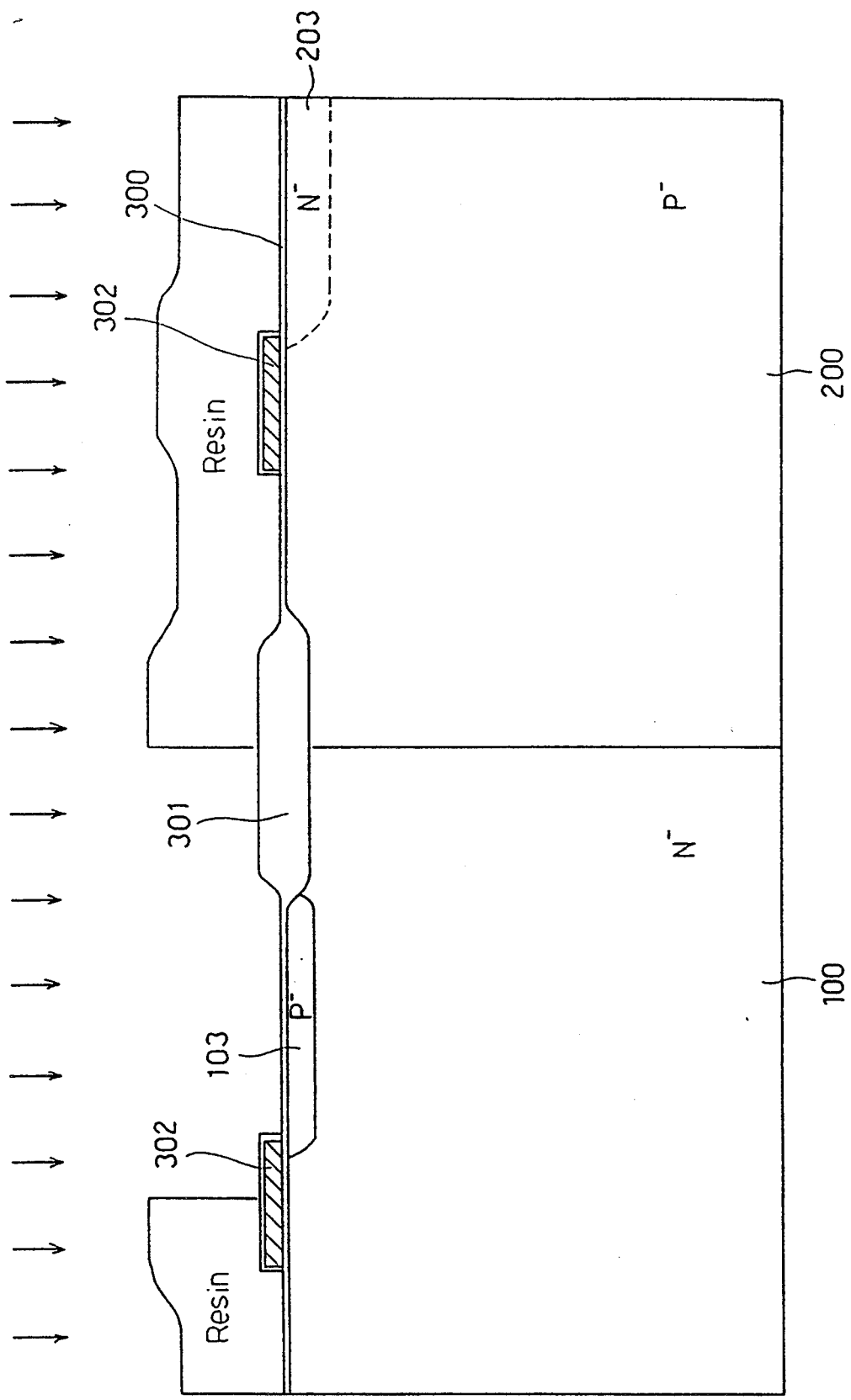
Figure 22:
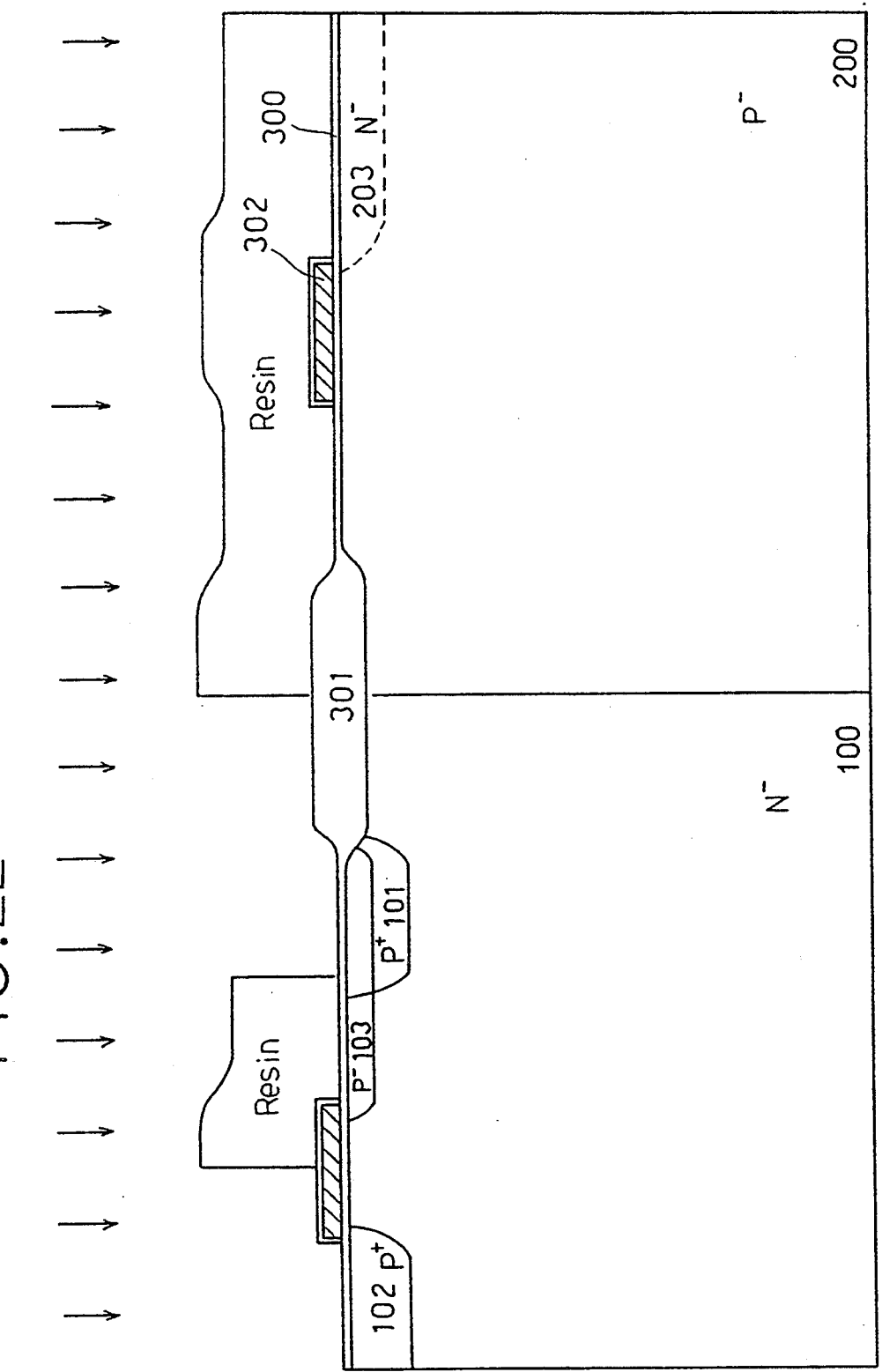
Figure 23:
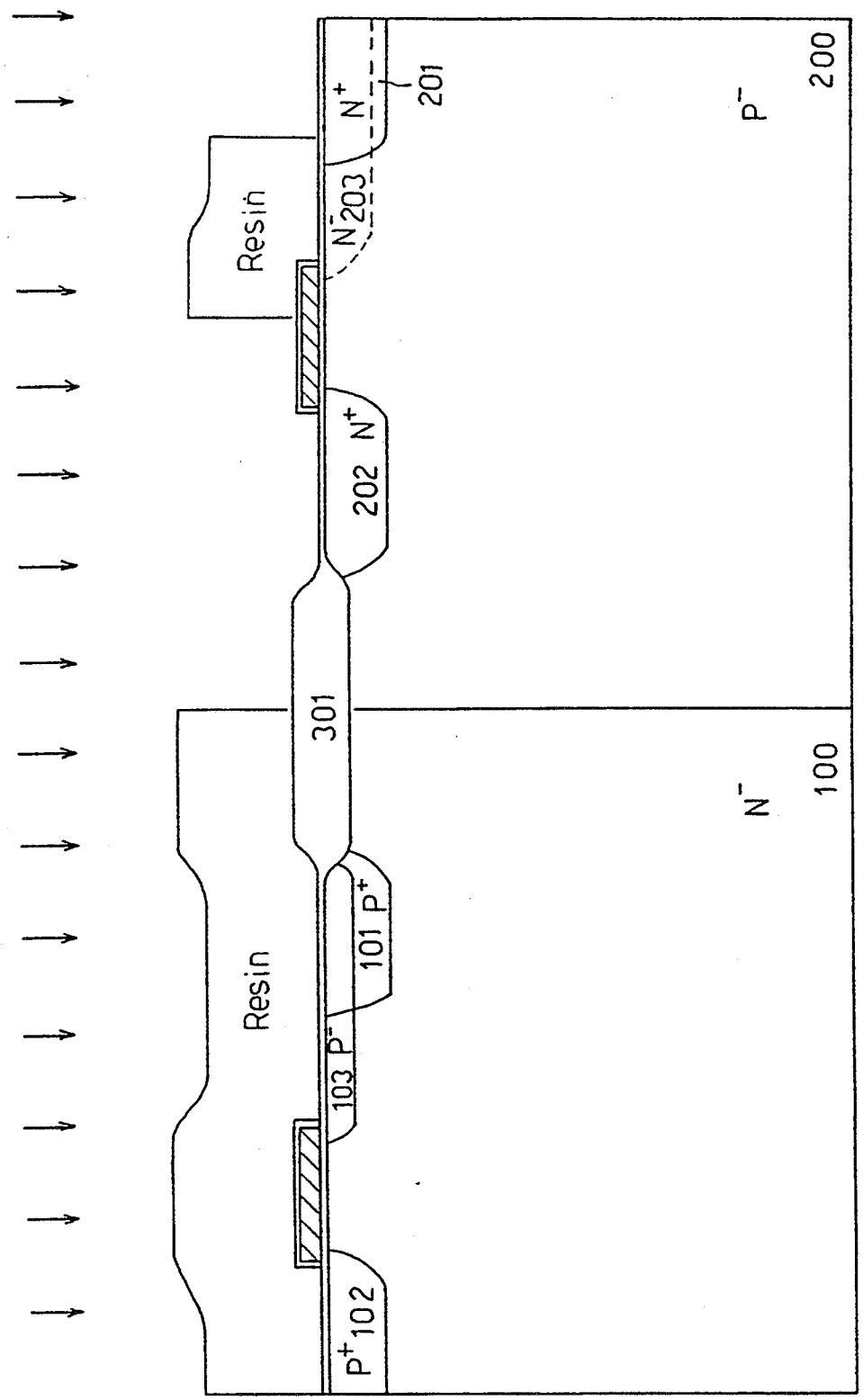

As is well known, the withstanding voltage of a device is generally determined by a ratio of the P type impurity concentration to the N type impurity concentration at a P-N junction. Therefore, to get the same breakdown voltage of a drain junction as the conventional offset structure shown in FIG. 18A, the impurity concentration of the offset region 103 is determined in consideration of the impurity concentration of the double offset region 105 because the offset region 103 is surrounded by the double offset region 105. It is noted that, because the impurity concentration of the double offset region 105 is higher than that of the silicon substrate 100, it is possible to increase the carrier concentration in the offset region 103. Therefore, it is possible to reduce the resistance of the offset region 103 serving as a resistor layer.

According to the double offset structure of this embodiment, it is possible to increase the impurity concentration of the offset region 103 without impairing the breakdown voltage of the drain junction. Consequently, it is possible to get a high withstanding voltage MIS transistor having a high current gain. Moreover, electric characteristics, such as the above-mentioned breakdown voltage of the drain junction, or the current gain, may be determined regardless of the impurity concentration of the silicon substrate. This is because the portion in which the breakdown happens is determined by the concentration distribution and the junction depth of the offset region 103, the drain region 101, and the double offset region 105. Generally speaking, the impurity concentration of the silicon substrate 100 is restricted to a certain extent. The reason why is that when the impurity concentration of the silicon substrate 100 is high, operating speed (access time) of the MIS transistor is decreased. The slowed operation speed is not only due to the reduced breakdown voltage but also due to both the junction capacitance and the gate capacitance are high. Here, the above-mentioned double offset structure can be adopted to incorporate a wide range of an impurity concentrations in the substrate or a well region, whereby a design advantage is obtained.

The impurity concentrations used in samples that were experimentally manufactured will now be described. The sample is a high withstanding voltage P type channel MOS transistor formed in the silicon substrate 100 having a surface impurity concentration of $2.3 \times 10^{16}/cm^3$. Both surface impurity concentrations of the source region 102 and the drain region 101 are $1.5 \times 10^{19}/cm^3$. The impurity concentration of the double offset region 105 is $3 \times 10^{17}/cm^3$. The impurity concentration of the offset region 103 is set in a range between $4.0 \times 10^{17} - 1.0 \times 10^{18}/cm^3$. The thickness of the gate oxide film is 300 angstroms. The gate length L of the MIS transistor is 2.625 micrometer. The gate width W of the MIS transistor is 6 micrometer. The offset length OL of the MIS transistor is 1.5 micrometer.

Figure 2A:
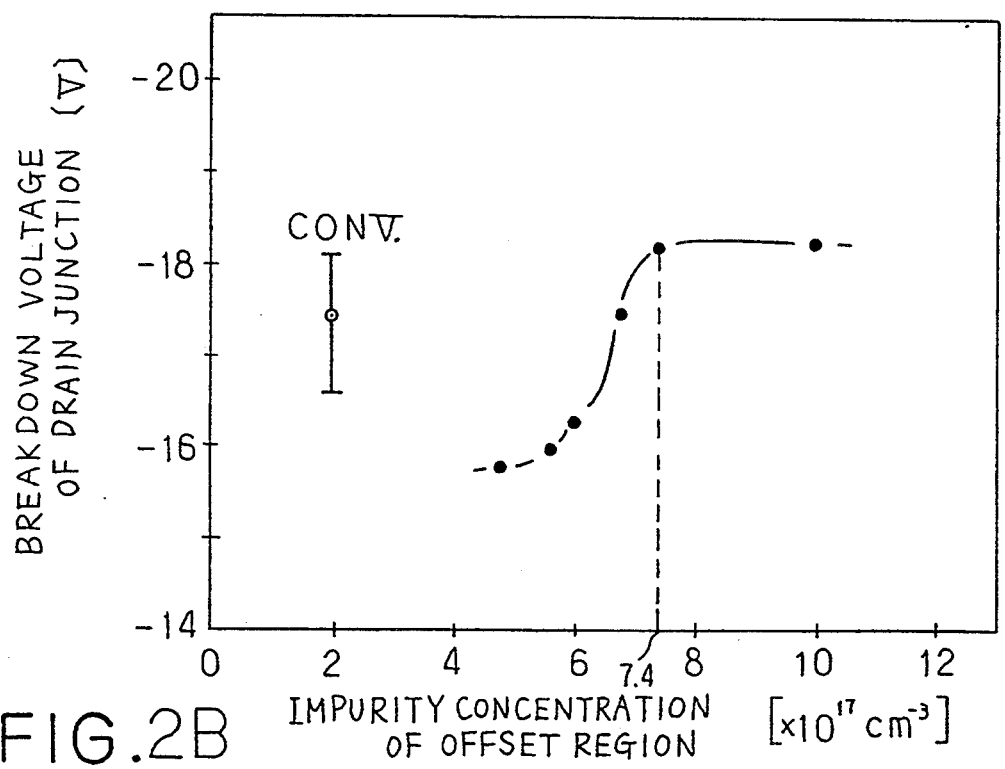
FIG. 2A shows the relationship between an impurity concentration of an offset region and a breakdown voltage of a drain junction.
Figure 2B:
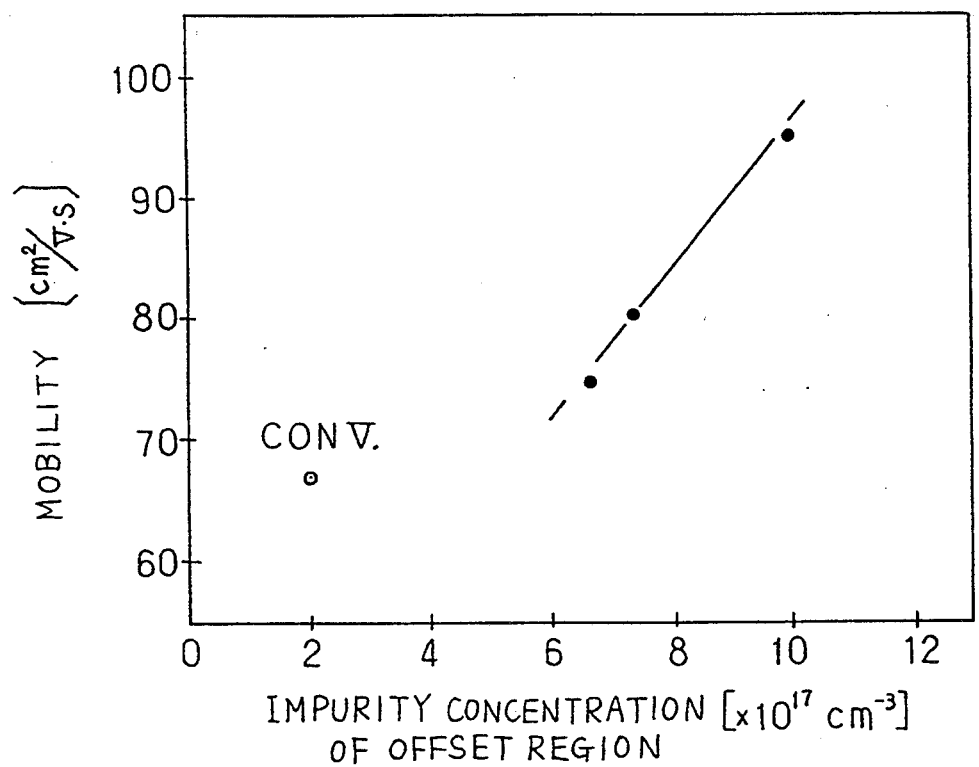
FIG. 2B shows the relationship between an impurity concentration of an offset region and mobility.

The resultants of actual measurement of the breakdown voltage of the drain junction and the mobility are shown in FIGS. 2A and 2B. In FIGS. 2A and 2B, black circles are for the above-mentioned sample, and a white circle is for the conventional offset gate structure shown in FIG. 18A, in which an impurity concentration of the offset region 103 is $2 \times 10^{17}/cm^3$. As shown in FIG. 2A, when the impurity concentration is high, the sample has approximately the same breakdown voltage as the drain junction of the conventional offset gate structure. With regard to the mobility, as shown in FIG. 2B, when the impurity concentration is high, the mobility of the sample is 1.1-1.4 times as high as that of the conventional offset gate structure. Therefore, it is understood that the current gain of the sample is higher than that of the conventional offset gate structure.

Referring to FIG. 2A, it is noted that, when the impurity concentration of the offset region 103 is more than $7.4 \times 10^{17}/cm^3$, the breakdown voltage of the drain junction of the sample falls within a range in which the breakdown voltage is saturated or does not vary with respect to the impurity concentration. Therefore, it is possible to obtain a very stable breakdown voltage that is uneffected by small variation in the impurity concentration. We believe that the following model explains the reason why the breakdown voltage is saturated or does not vary. When the impurity concentration is more than $7.4 \times 10^{17}/cm^3$, the spread of a depletion layer at a P-N junction is substantially constant, therefore, the portion in which avalanche breakdown happens is at a fixed portion of the MIS transistor.

Figure 3A:
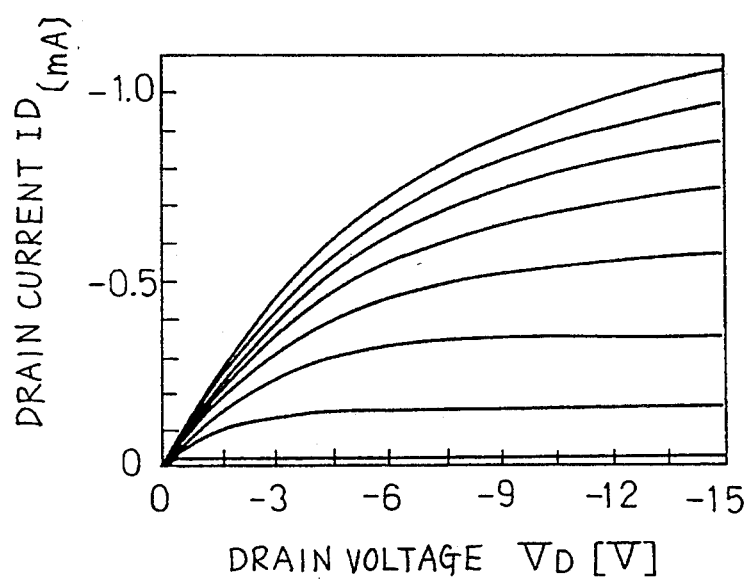
FIG. 3A shows the relationship between a drain voltage and a drain current of a conventional structure.
Figure 3B:
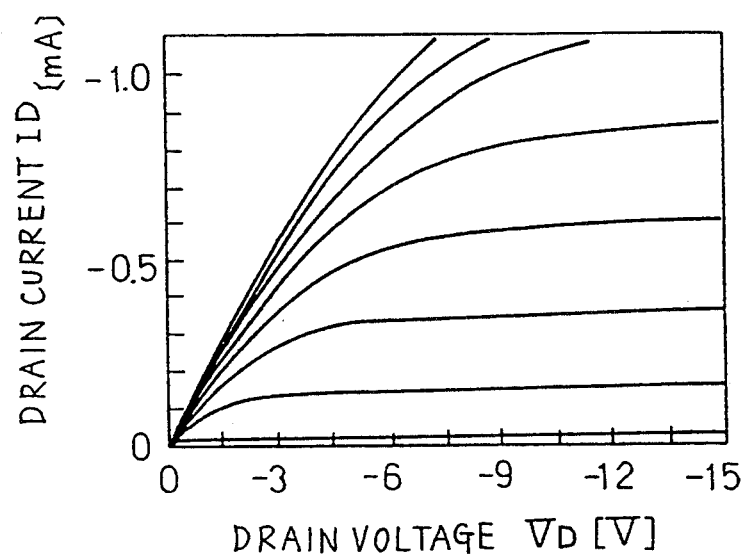
FIG. 3B shows the relationship between a drain voltage and a drain current of the structure shown in FIG. 1.
Figure 4A:
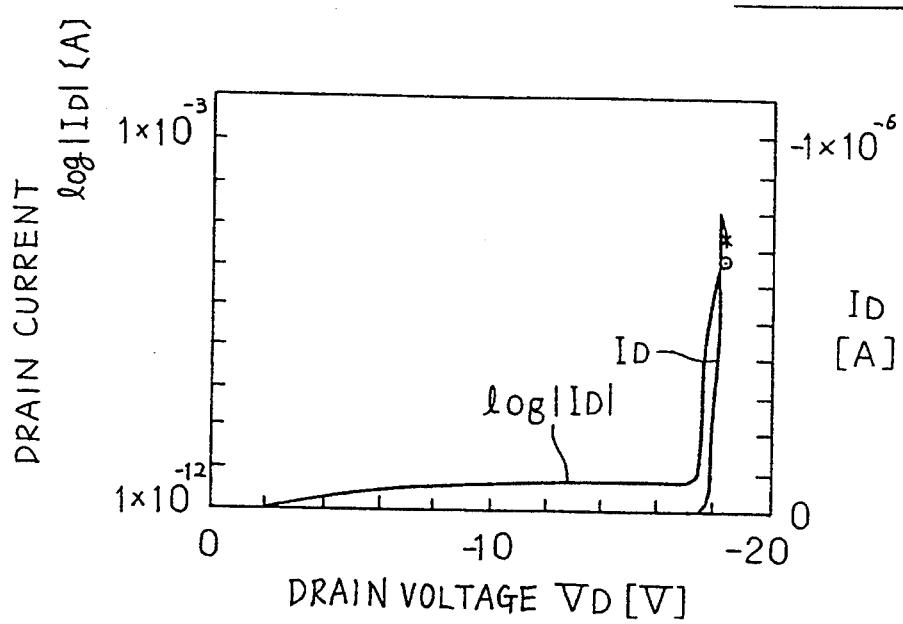
FIG. 4A shows a breakdown voltage of a drain junction of a conventional structure.
Figure 4B:
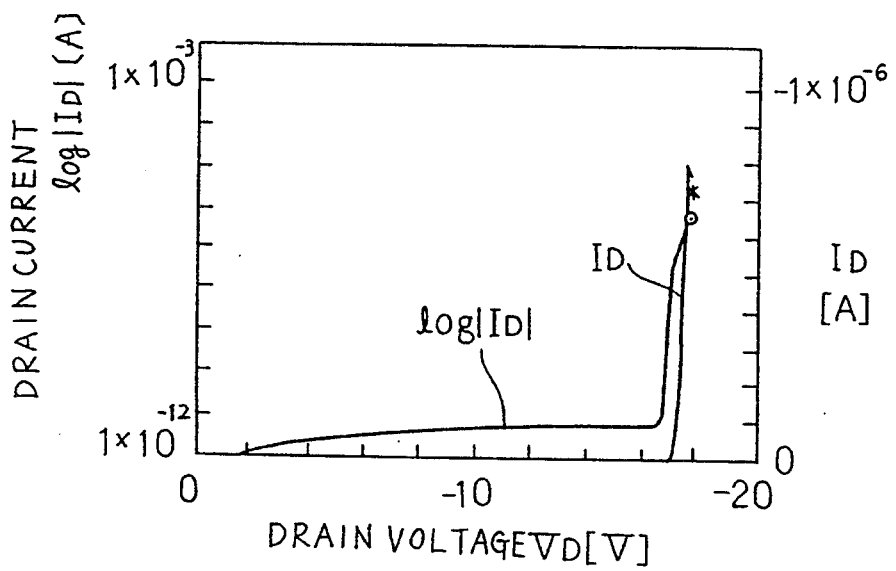
FIG. 4B shows a breakdown voltage of a drain junction of the structure shown in FIG. 1.

FIGS. 3A and 4A show the I-V characteristic and the breakdown voltage of the drain junction of the conventional offset gate structure respectively. FIGS. 3B and 4B show the I-V characteristic and the breakdown voltage of the drain junction of the sample in which the impurity concentration of the offset region 103 is $1.0 \times 10^{18}/cm^3$. In FIGS. 3A and 3B, each I-V characteristic shows the relationship between a drain voltage $V_D$ and a drain current $I_D$ when a gate voltage $V_G$ was changed from 0V to $-16V$ by $-2V$. As understood by the comparison FIG. 3A with FIG. 3B, the drain current at a linear region in low drain voltage is steeper than that of the conventional offset gate structure. Therefore, the current gain of the sample is improved, and the resistance of the offset region 103 is considerably reduced. On the other hand, as shown in FIGS. 4A and 4B, even if the impurity concentration of the offset region 103 is high, the breakdown voltage of the drain junction of the sample is not lower than that of the conventional offset gate structure.

An optimal value of the impurity concentration of the offset region 103 will now be described. As shown in FIG. 2B, the higher the impurity concentration of the offset region 103 becomes, the higher the mobility becomes. Further, as shown in FIG. 2A, when the concentration of the impurity in the offset region 103 is too low with respect to the impurity concentration of the double offset region 105, the breakdown voltage is required because the offset region 103 is effectively not formed. On the other hand, when the concentration is too high, the offset effect is similarly eliminated. Therefore, we believe that there is the optimal value of the impurity concentration of the offset region 103.

Figure 5A:
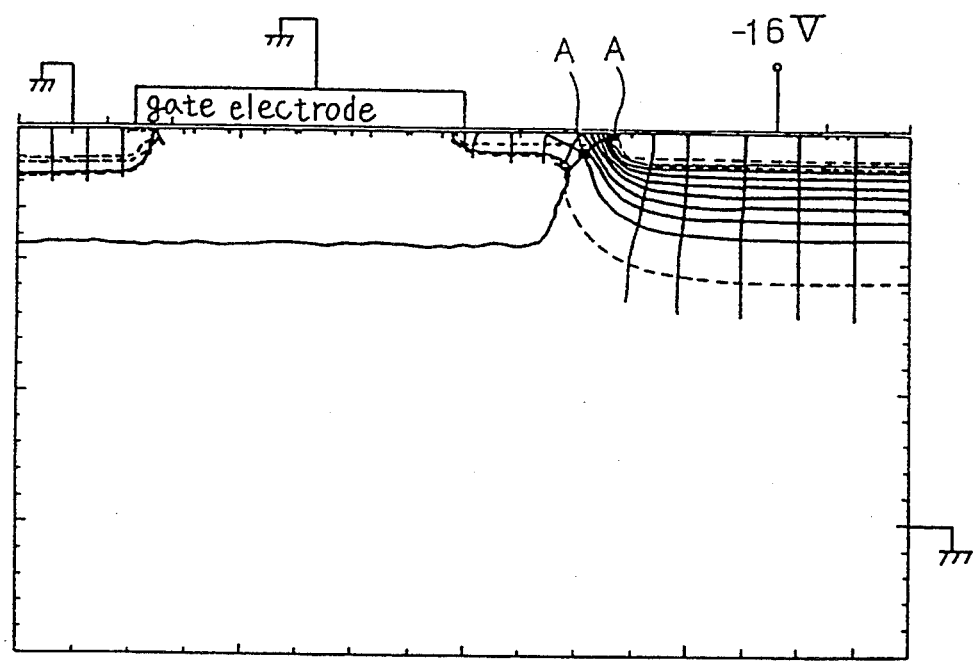
FIGS. 5A and 5B are the resultant of simulation showing a distribution of an electric field of the structure shown in FIG. 1.
Figure 5B:
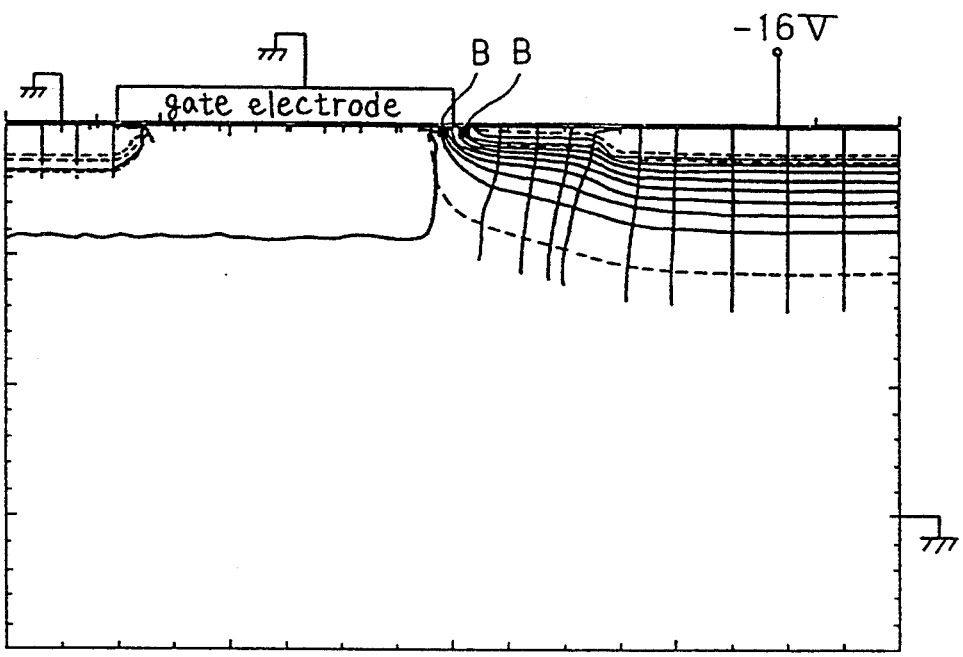

FIGS. 5A and 5B show the resultants of simulation when the impurity concentration of the offset region 103 was changed. FIGS. 5A and 5B show a distribution of an electric field, that is a spread of a depletion layer, when a substrate potential (ground) is added to the gate electrode 302 and the source region 102, and a potential of $-16V$ is added to the drain region 101. In FIG. 5A, the quantity of P type impurity implanted is $0.8 \times 10^{13}$. In this case, the electric field is concentrated between the offset region 103 and the drain region 101. A breakdown happens along line A—A of FIG. 5A. The breakdown voltage calculated by the simulation is $-15.8V$. In FIG. 5B, the quantity of P type impurity dosed is $2.0 \times 10^{13}$. In this case, the electric field is concentrated between the offset region 103 and the gate electrode 302, that is an edge of the gate electrode 302. The breakdown happens along line B—B of FIG. 5B. The breakdown voltage calculated by the simulation is $-14.5V$. According to the above-mentioned results, it is desired to design the impurity concentration of the offset region 103 so that the impurity concentration is higher than that of the double offset region 105, and is lower than that of the drain region 101. Moreover, the electric field is not locally concentrated.

Figure 6:
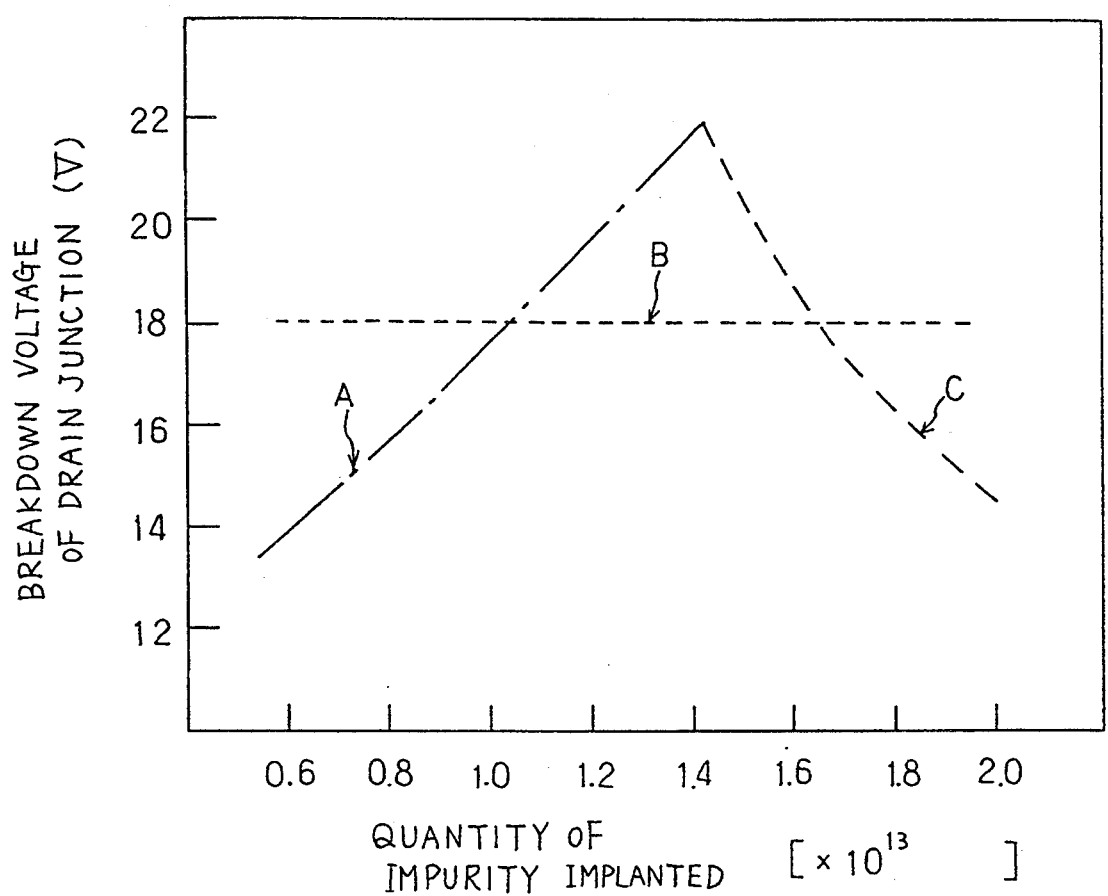
FIG. 6 shows a characteristic of a breakdown voltage of a drain junction.

FIG. 6 shows the relationship between the quantity of a P type impurity implanted for forming the offset region 103 and the breakdown voltage of the drain junction of the sample in which the double offset region 105 has a concentration of $3 \times 10^{17}/cm^3$. Line A shows a characteristic that the breakdown happens between the offset region 103 and the drain region 101 like the sample in FIG. 5A. Line B shows a characteristic that, when the MIS transistor is surrounded by a thick field oxide film (LOCOS film), the breakdown happens at an edge of the drain region 101. The edge is not on the side of the gate electrode 302 but on the side of the LOCOS film. In this case, the breakdown voltage does not depend on the quantity of the P type impurity implanted. Line C show a characteristic that the breakdown happens at the edge of the gate electrode 302 like the sample shown in FIG. 5B.

As understood from FIG. 6, there is the optimal value of the quantity of the impurity implanted for forming the offset region 103 in accordance with the desired breakdown voltage of the drain junction. Therefore, it is desired to determine the quantity of the impurity implanted so that the offset region 103 has an optimal impurity concentration to the impurity concentration of the double offset region 105.

Figure 24A:
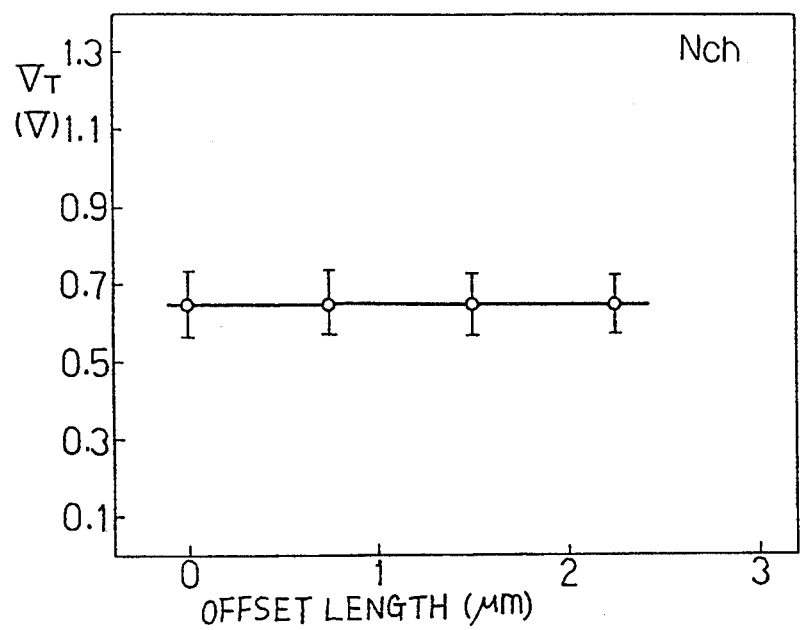
FIG. 24A shows the relationship between an offset length and a threshold voltage of an N type channel MOS transistor having a double offset gate structure.
Figure 24B:
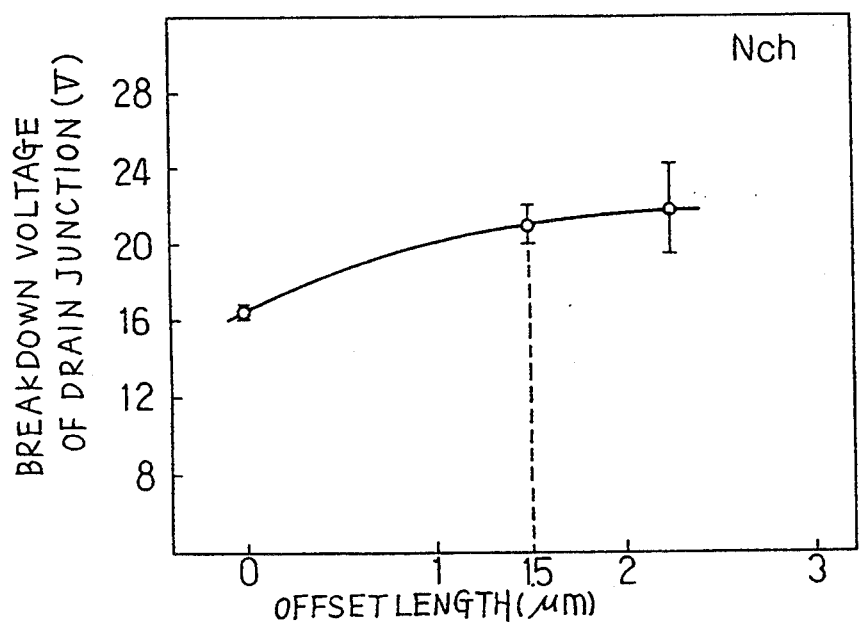
FIG. 24B shows the relationship between an offset length and a breakdown voltage of a drain junction of N type channel MOS transistor having a double offset gate structure.
Figure 25A:
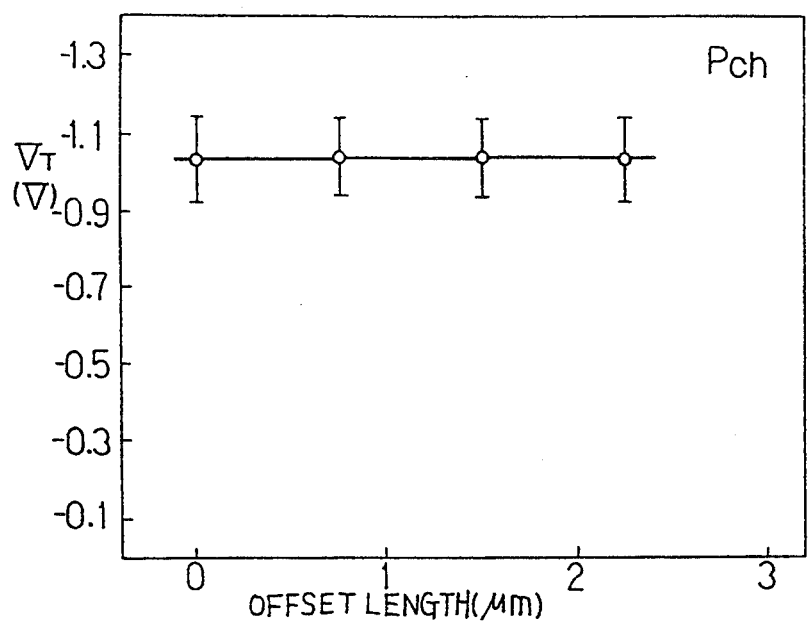
FIG. 25A shows the relationship betweenan offset length and a threshold voltage of P type channel MOS transistor having a double offset gate structure.
Figure 25B:
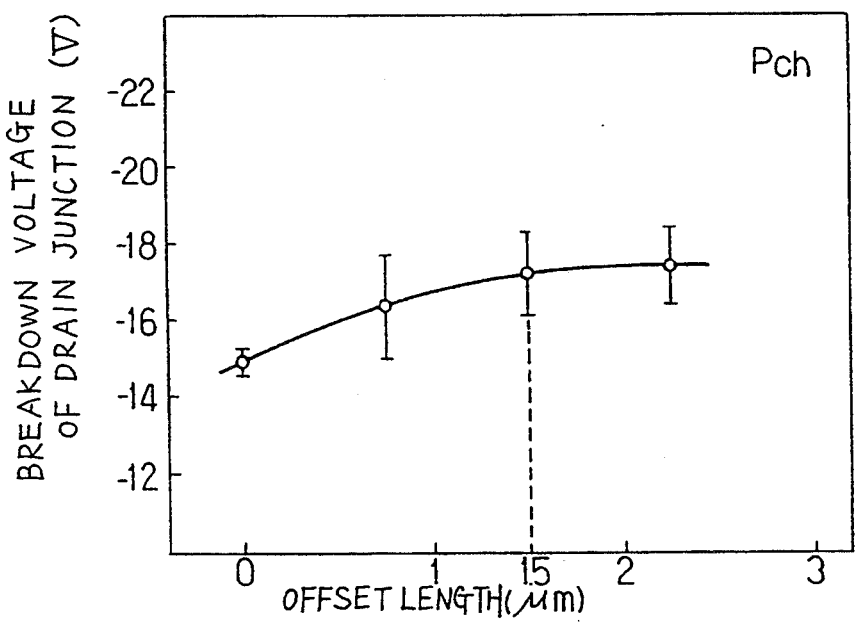
FIG. 25B shows the relationship between an offset length and a breakdown voltage of a drain junction of a P type channel MOS transistor having a double offset gate structure.

As shown in FIGS. 24A and 25A, even if the offset length OL is changed, the threshold voltage of the MOS transistor is not changed. Moreover, as shown in FIGS. 24B and 25B, when the offset length OL is more than 1.5 micrometer, the breakdown voltage of the drain junction is approximately constant, whereby a design advantage is obtained. Here, the data shown in FIGS. 24A, 24B, 25A, and 25B are the mean value and the value of $3\sigma_{n-1}$ of the results of measurement for ten experimentally manufactured samples, in which the gate width W was 6 micrometer, the gate length L was 2,625 micrometer, and the drain current $I_D$ was 1 micro ampere.

The process of manufacturing a CMOS transistor having the above-mentioned P type channel MOS transistor will now be described with reference to FIGS. 7 to 11.

Figure 7:
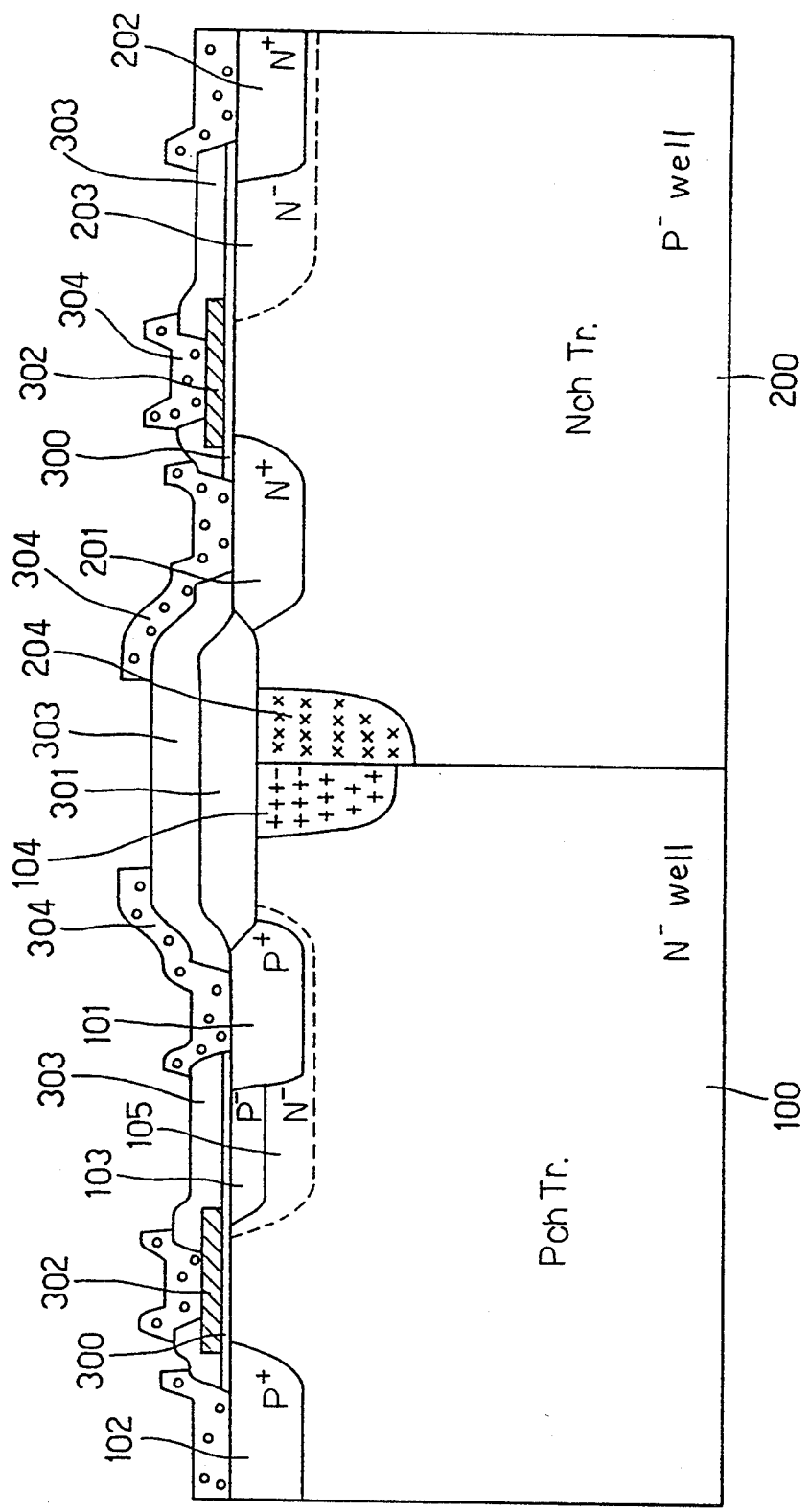
FIG. 7 is a sectional view of a CMOS device having the structure shown in FIG. 1.
Figure 8:
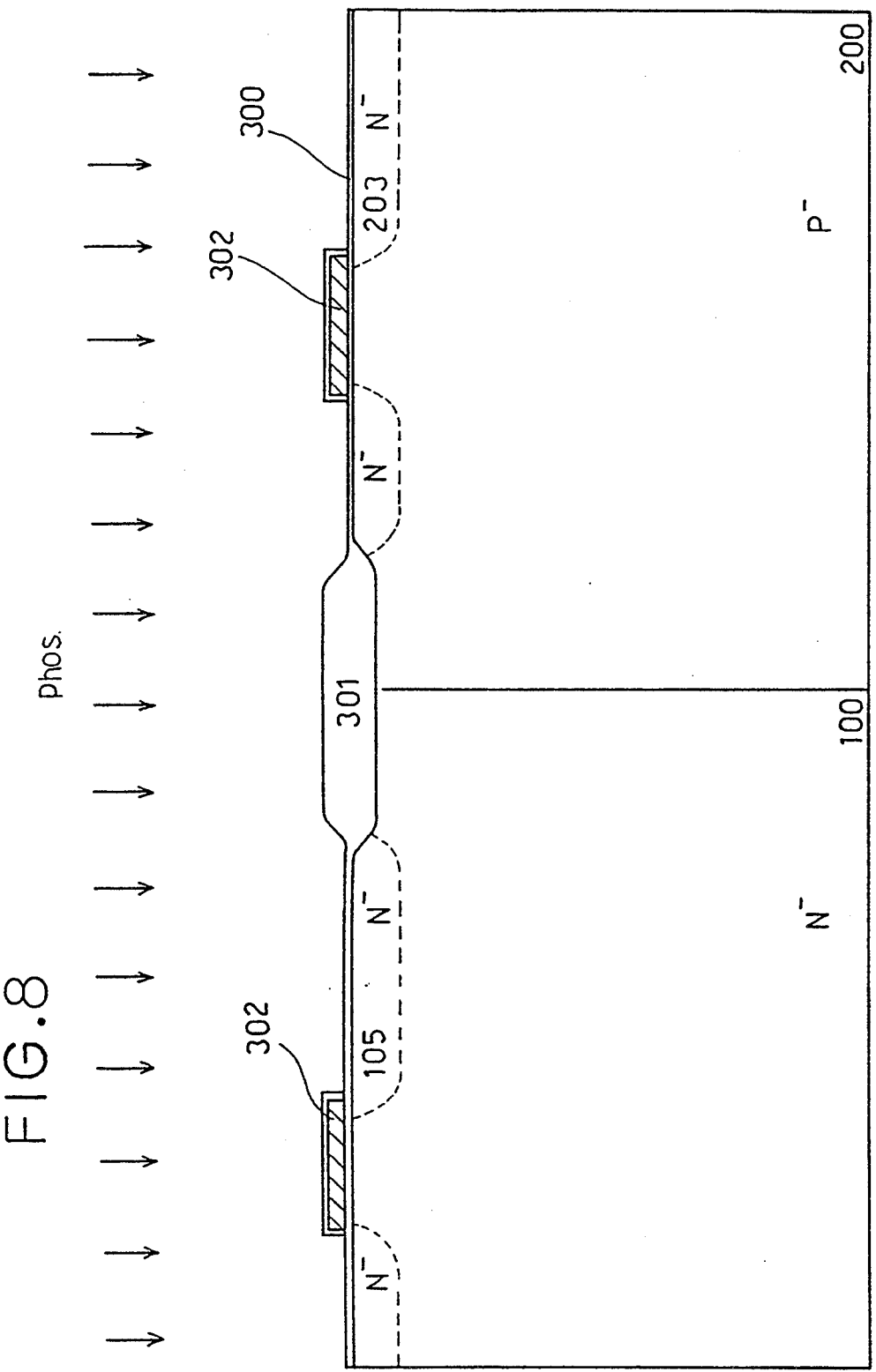
FIGS. 8 to 11 are sectional views for explaining the manufacturing steps for the CMOS device shown in FIG. 7.

In FIG. 8, a P⁻type silicon substrate is prepared. An oxide film is formed on a main surface of the P⁻type silicon substrate. A photoresist layer is deposited and selectively photoetched to cover the region that will form an N⁻type well region 100. A P⁻type well region 200 is formed by ion-implanting boron (B) into the P' type silicon substrate. The photoresist layer is stripped. A photoresist layer is then deposited and selectively photoetched so that the P' type well region 200 is covered. An N⁻type well region 100 is formed by ion-implanting phosphorus (P) into the P⁻type silicon substrate. The photo-resist layer is stripped. After the N⁻type well region 100 is formed, drive-in is carried out so as to control the diffusion depth of the P⁻type well region 200 and the N⁻type well region 100. It is noted that FIGS. 7 to 11 show only the P⁻type well region 200 and the N⁻type well region 100 without showing other regions in the P⁻type silicon substrate.

A nitride film is then selectively formed. A LOCOS oxidation is carried out so as to form a field oxide film 301. The nitride film and the oxide film are removed. A gate oxide film 300 having a thickness of 300–400 angstroms is formed on the main surface of the P⁻type silicon substrate.

A polycrystalline silicon layer is deposited by a LPCVD (Low Pressure Chemical Vapour Deposition) method. The polycrystalline silicon layer is selectively etched off to form a gate electrode 302. The surface of the gate electrode 302 is oxidized. Channel stopper regions 104 and 204 shown in FIG. 7 may be formed as the need arises. N type impurities, such as phosphorus (P), are ion-implanted into the P⁻type well region 200 and the N⁻type well region 100 to form an N⁻type double offset region 105 and an N⁻type offset region 203 in a self alignment manner using the gate electrode 302 as a mask. A heat-treatment is carried out so that the diffusion depths of the double offset region 105 and the offset region 203 are deeper than that of the regions that will form drain regions 101 and 202 and that the N type impurities are activated. It is noted that this heat-treatment may be carried out simultaneously when the surface of the gate electrode 302 is oxidized. When an adjustment of an implant energy can make the diffusion depths of double offset region 105 and the offset region 203 deeper than that of the drain regions 101 and 202, the heat-treatment may be omitted. In the above-mentioned experimentally manufactured sample, a $7 \times 10^{12}$ dose of phosphorus (P) is ion-implanted in with an energy of 90 KeV. Thereafter, the heat-treatment was carried out at 1000° C. for 40 minutes.

Figure 9:
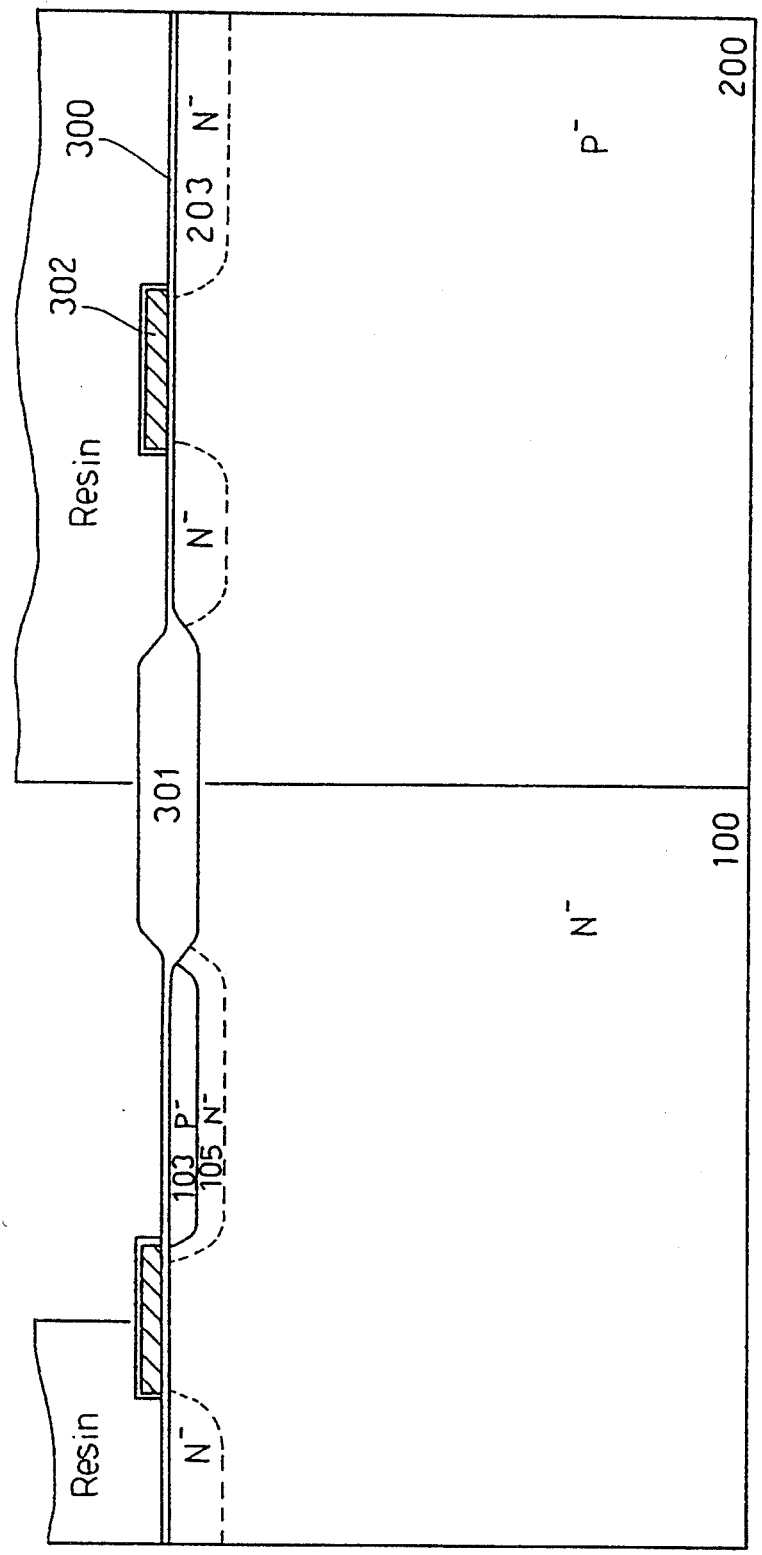

In FIG. 9, a photoresist layer is deposited and selectively photoetched to uncover the region that will form a P⁻type offset region 103. Impurities, such as boron (B), are ion-implanted into the double offset region 105 to form the P⁻type offset region 103. The implant energy of the ion implantation is adjusted so that the diffusion depth of the offset region 103 is shallower than that of the double offset region 105. The quantity of the inplanted impurities is also adjusted so that the conductivity type (N) of a portion of the double offset region 105 is transformed to the opposite conductivity type (P) such that the desired breakdown voltage of the drain junction is obtained. The photoresist layer is stripped. In the above-mentioned sample, boron (B) of $1.6 \times 10^{13}$ dose were ion-implanted in which the implant energy was 30 KeV. After heat-treatment, the diffusion depths of the offset region 103 and the double offset region 105 were finally about 0.1 micrometer and 0.3 micrometer respectively.

Figure 10:
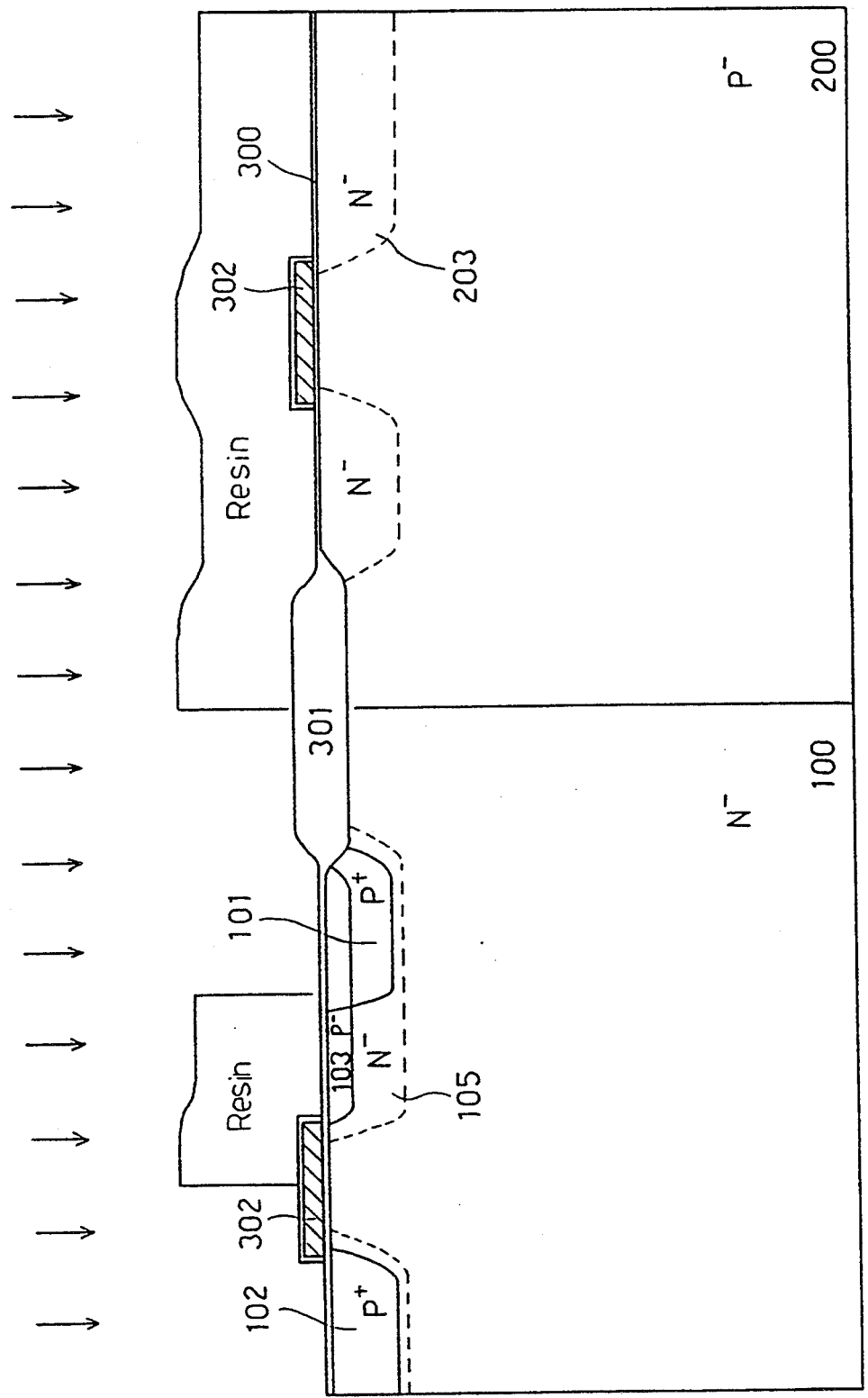

In FIG. 10, a photoresist layer is deposited and selectively photoetched to uncover the region that will form a P⁺type source region 102 and the drain region 101 of a P type channel MOS transistor. Impurities, such as boron (B), are ion-implanted into the double offset region 105 to form the source region 102 and the drain region 101. The diffusion depths of the source region 102 and the drain region 101 were 0.25 micrometer. The photoresist layer is then stripped.

Figure 11:
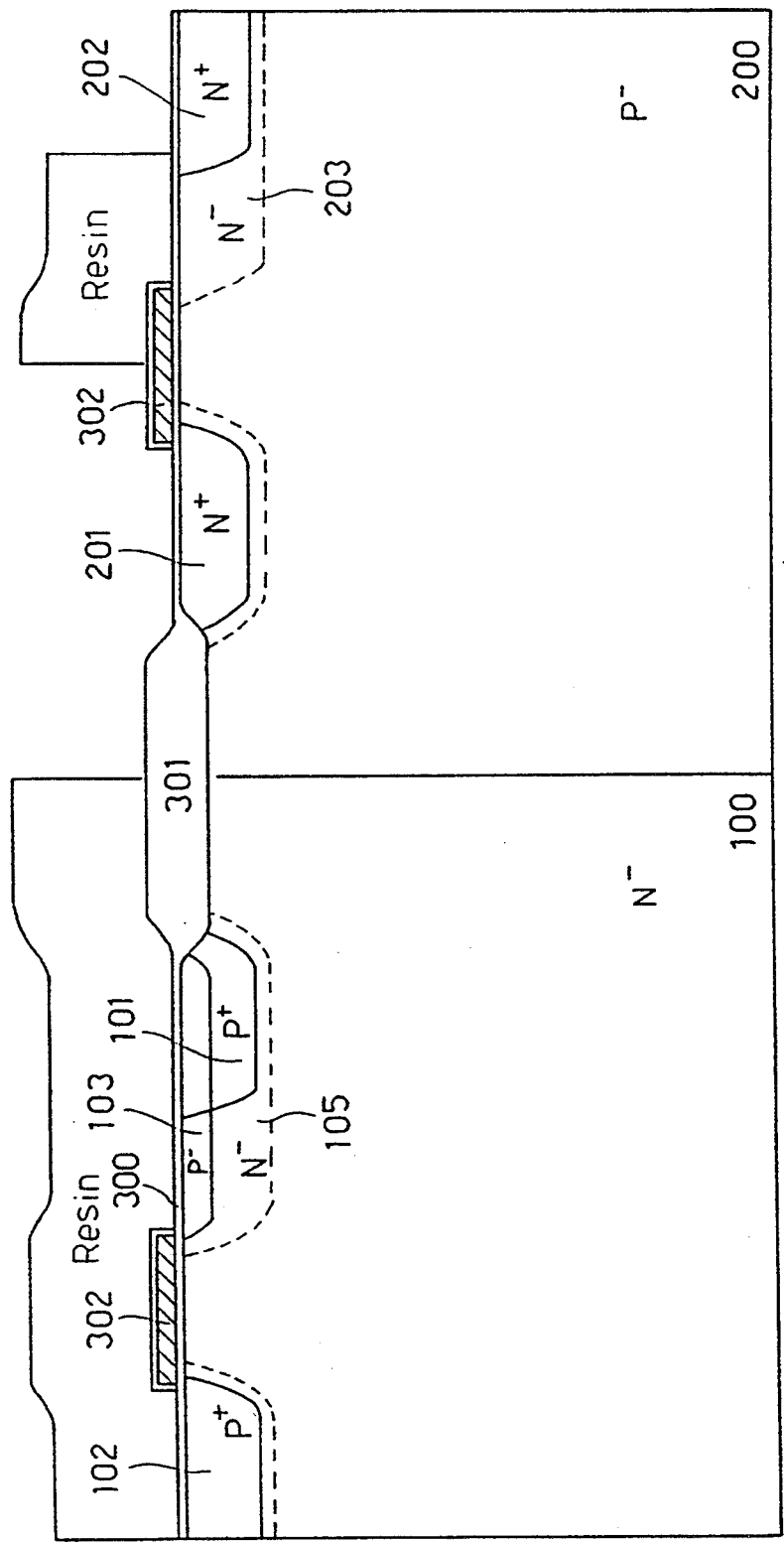

In FIG. 11, a photoresist layer is deposited and selectively photoetched to uncover the regions that will form an N⁺type source region 201 and the drain region 202 of an N type channel MOS transistor. Impurities, such as arsenic (As), are ion-implanted into the offset region 203 to form the source region 201 and the drain region 202.

After activation of the impurities, a passivation film 303 is formed. Contact holes are selectively opened in the passivation film 303. Electrode lines 304 are then selectively formed. Thus, the CMOS shown in FIG. 7 is manufactured.

According to the above-mentioned process of manufacturing, it is necessary to carry out three photoetching processes and four ion-implanting steps to get the withstanding voltage structure after the gate electrode 302 is formed. This is because the double offset region 105 of the P type channel MOS transistor and the offset region 203 of the N type channel MOS transistor is simultaneously formed. Therefore, the number of photoetching steps of this embodiment is fewer than that of the conventional process shown in FIGS. 20 to 23 by one step.

Moreover, when the P type channel MOS transistor of the CMOS transistor has the above-mentioned double offset structure, it is possible to improve the current gain of the P type channel MOS transistor even if its size is small. Therefore, because it is possible to balance between the current of the P type channel MOS transistor and that of the N type channel MOS transistor even if the sizes of these transistors are small, it becomes easy to integrate.

Other embodiments of the present invention will be described with reference to FIGS. 12 to 17.

Figure 12:
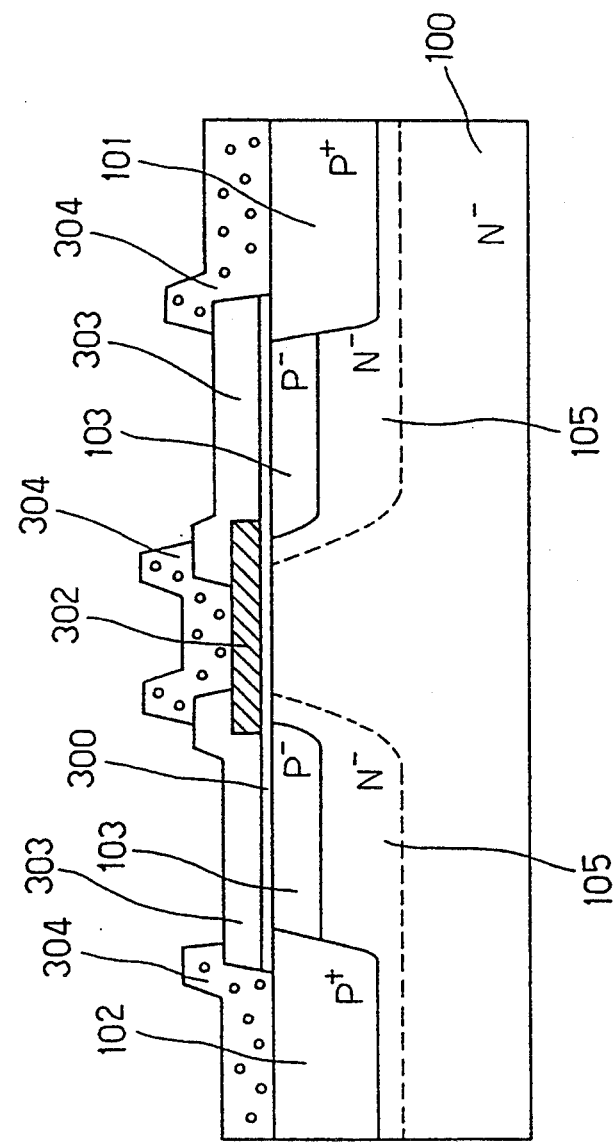
FIGS. 12 to 17 are sectional views of other embodiments of the present invention.

In FIG. 12, a P type channel MOS transistor has the above-mentioned double offset structure not only on the side of the drain region 101 but also on the side of the source region 102.

Figure 13:
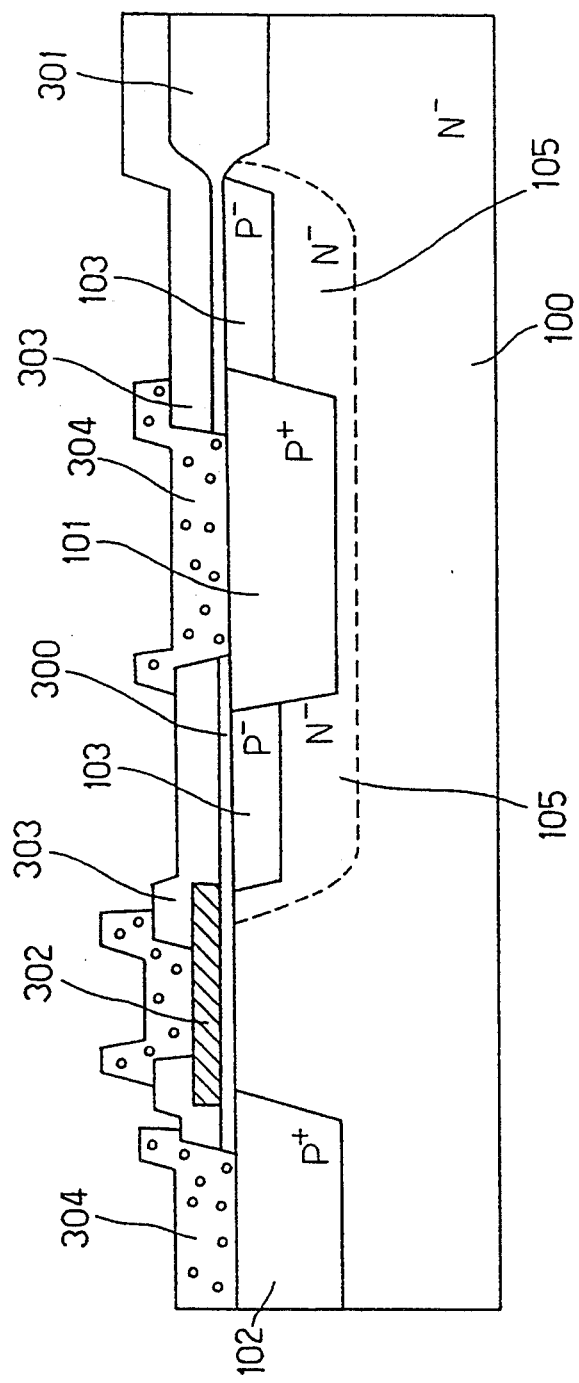

In FIG. 13, a P type channel MOS transistor has the double offset structure not only on the side of the gate electrode 302 but also on the side of the field oxide film 301 in consideration of the breakdown which happens at the edge of the drain region 101 on the side of the field oxide film 301.

Figure 14:
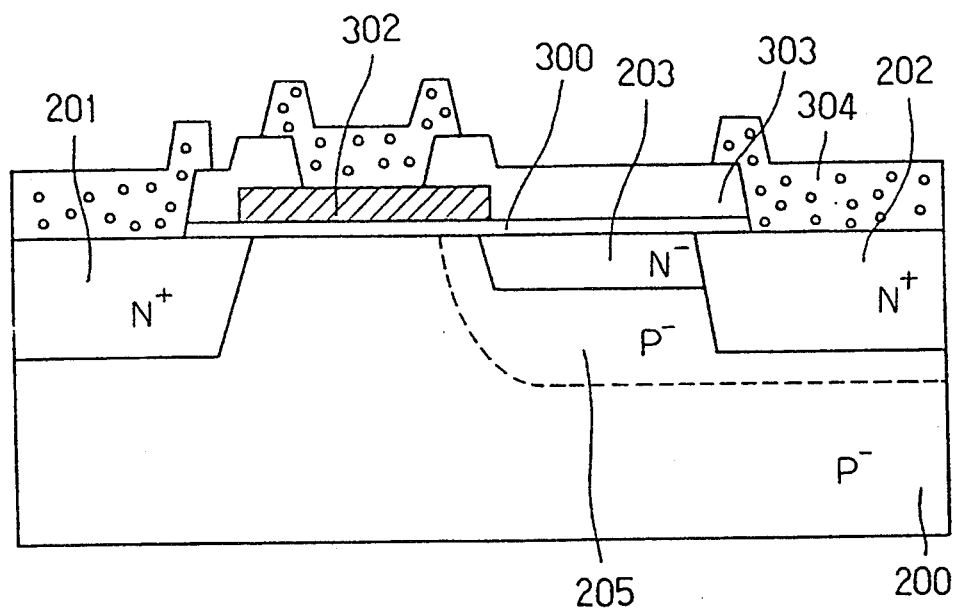
Figure 15:
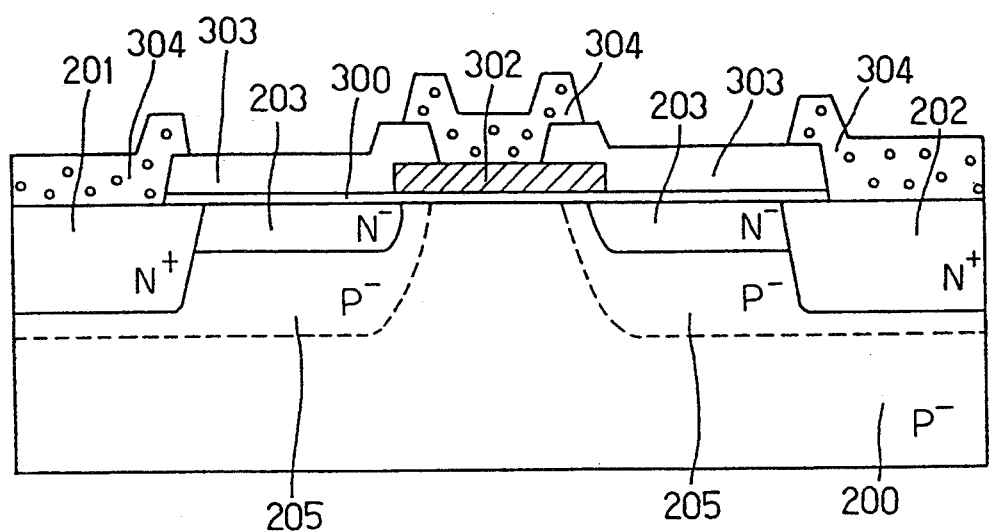
Figure 16:
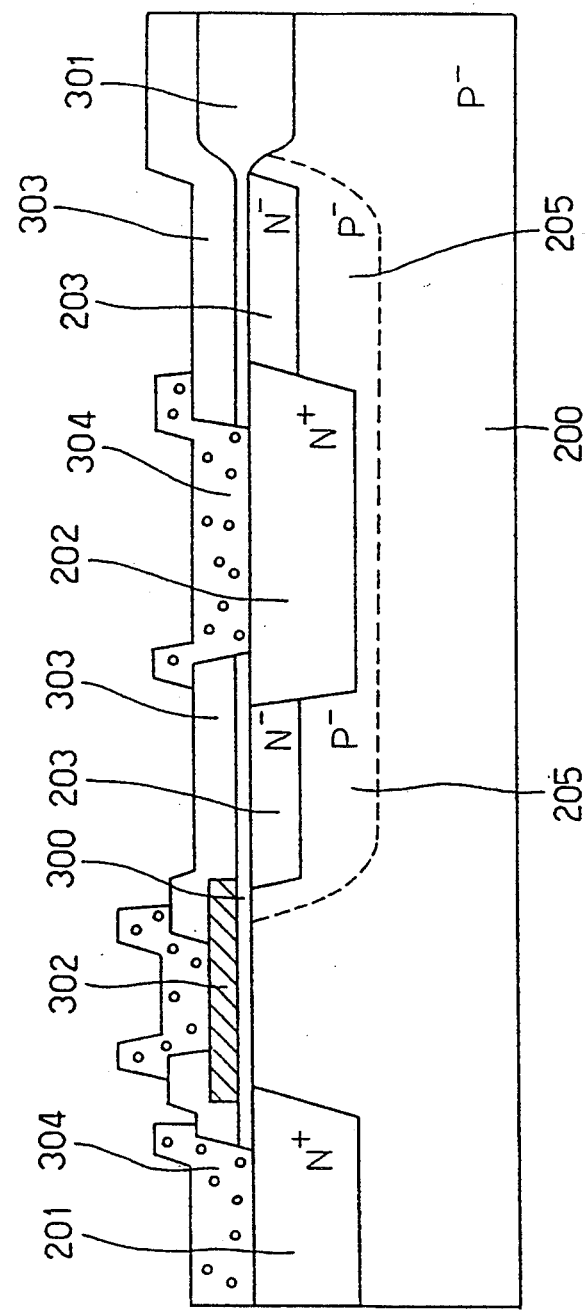

As shown in FIGS. 14 to 16, the conductivity type of the channel of the MOS transistor having the double offset structure may be not only P type but also N type. In FIGS. 14 to 16, a P−type double region 205 is formed. With regard to a programming circuit of a non-volatile memory, such as EPROM (Erasable PROM), it is known that programming characteristics is improved by improving a current gain of the N type channel MOS transistor. Therefore, it is effective to adopt the double offset structure to the N type channel MOS transistor. Here, in EPROM or EEPROM (Electrically-Erasable PROM), a programming voltage is generally 12±0.5V. Therefore, a withstanding voltage more than 18V is required.

Figure 17:
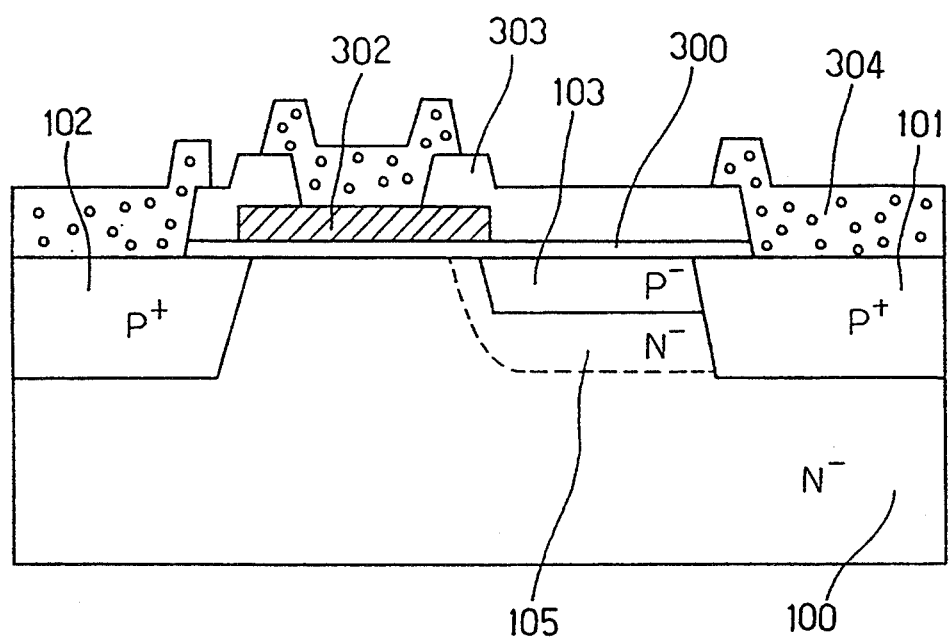

In the above-mentioned embodiments, the double offset region 105, 205 surrounds not only the offset region 103, 203 but also the source region 102, 201 and the drain region 101, 202, as shown in FIG. 17, the double offset region 105, 205 may surround only the offset region 103,203. However, it is noted that, when the structure shown in FIG. 17 is adopted, it is necessary to consider the relationship between the impurity concentration of the offset region 103 and that of the double offset region 105, the relationship between the impurity concentration of the drain region 101 and that of the double offset region 105, and the relationship between the impurity concentration of the drain region 101 and that of the silicon substrate 100. However, with the structure shown in FIG. 1, it is necessary to consider only the relationship between the impurity concentration of the offset region 103 and that of the double offset region 105 as well as the relationship between the impurity concentration of the drain region 101 and that of the double offset region 105. Therefore, the structure shown in FIG. 1 can be designed more easily than the structure shown in FIG. 17.

The gate insulating film of the MOS transistor may be an insulating film other than the oxide film, such as a nitride film.

What is claimed is:

1. A method of manufacturing a CMOS transistor, comprising the steps of:

(a) preparing a semiconductor substrate having a first region and a second region, said first region having a first conductivity type, said second region having a second conductivity type;

(b) forming an insulating film covering surfaces of said first and said second regions;

(c) forming a first gate electrode and a second gate electrode on said insulating film over said first and said second regions respectively;

(d) implanting a first conductivity type impurity into said first and said second regions to form first diffusion regions, wherein said first and said second gate electrodes are used as a mask, an impurity concentration of said first diffusion region in said first region being higher than an impurity concentration of said first region other than said first diffusion region, said first diffusion region in said second region having said first conductivity type;

(e) implanting a second conductivity type impurity into at least one of said first diffusion regions in said first region to form an offset region, said offset region having said second conductivity type, said one of said first diffusion regions being a double offset region, at least a portion of said double offset region overlapping with said offset region;

(f) implanting a second conductivity type impurity into said first region to form a first source region and a first drain region, wherein said first source region and said first drain region have said second conductivity type, an impurity concentration of said offset region being lower than an impurity concentration of said first drain region, and said first drain region connected to said offset region, said offset region being disposed between said first gate electrode and said first drain region; and (g) implanting a first conductivity type impurity into said second region to form a second source region and a second drain region, an impurity concentration of said second source region and said second drain region being higher than an impurity concentration of said first diffusion regions, said second source region and said second drain region having said first conductivity type, said first diffusion region in said second region being disposed between said second gate electrode and said second drain region.

2. A method of manufacturing a CMOS transistor according to claim 1, wherein a diffusion depth of said double offset region is deeper than that of said offset region.

3. A method of manufacturing a CMOS transistor according to claim 2, wherein said diffusion depth of said double offset region is deeper than that of said first drain region, 4. A method of manufacturing a CMOS transistor according to claim 3, wherein said double offset region surrounds said offset region and said first drain region.

5. A method of manufacturing a CMOS transistor according to claim 2, wherein said double offset region surrounds said offset region.

6. A method of manufacturing a CMOS transistor according to claim 1, wherein said impurity concentration of said first region is set in a range between $1-5 \times 10^{16}/cm^3$, said impurity concentration of said first drain region is set in a range between $10^{19}-10^{20}/cm^3$, said impurity concentration of said offset region is set in a range between $10^{17}-10^{18}/cm^3$, and said impurity concentration of said double offset region is set in a range between $10^{17}-10^{18}/cm^3$.

7. A method of manufacturing a CMOS transistor according to claim 1, wherein gate lengths of said first and said second gate electrode are greater than 1 micrometer in length.

8. A method of manufacturing a CMOS transistor according to claim 7, wherein said gate lengths are greater than 2 micrometer in length.

9. A method of manufacturing a CMOS transistor according to claim 1, wherein said impurity concentration of said offset region is greater than $7.4 \times 10^{17}/cm^3$.

10. A method of manufacturing a CMOS transistor according to claim 1, wherein an offset length of said offset region is greater than 1 micrometer in length.

11. A method of manufacturing a CMOS transistor according to claim 10, wherein said offset length is greater than 1.5 micrometer in length.

12. A method of manufacturing a CMOS transistor according to claim 1, said first conductivity type is N type, and said second conductivity type is P type.

13. A method of manufacturing a CMOS transistor according to claim 1, said first conductivity type is P type, and said second conductivity type is N type.

* * * * *